United States Patent
Kirch

(10) Patent No.: US 10,769,447 B1
(45) Date of Patent: Sep. 8, 2020

(54) SYNCHRONOUS CONVERGENT PULSES REDUCE DIMENSIONS OF SERIAL SURFACES

(71) Applicant: Marc Joseph Kirch, Berkeley, CA (US)

(72) Inventor: Marc Joseph Kirch, Berkeley, CA (US)

( * ) Notice: Subject to any disclaimer, the term of this patent is extended or adjusted under 35 U.S.C. 154(b) by 0 days.

(21) Appl. No.: 15/732,565

(22) Filed: Nov. 29, 2017

Related U.S. Application Data

(60) Provisional application No. 62/497,726, filed on Dec. 1, 2016.

(51) Int. Cl.
| | |
|---|---|
| *G06K 9/00* | (2006.01) |
| *G06K 9/52* | (2006.01) |
| *G06N 3/00* | (2006.01) |
| *G06F 1/08* | (2006.01) |
| *G06N 7/00* | (2006.01) |
| *H03L 7/08* | (2006.01) |
| *G06N 3/04* | (2006.01) |

(52) U.S. Cl.
CPC ............ *G06K 9/00744* (2013.01); *G06F 1/08* (2013.01); *G06K 9/52* (2013.01); *G06N 3/008* (2013.01); *G06N 3/049* (2013.01); *G06N 7/005* (2013.01); *H03L 7/08* (2013.01)

(58) Field of Classification Search
CPC . H04L 67/1097; H04L 67/12; H04L 41/0654; H04L 41/12; H04L 41/28; H04L 7/0012; H04L 43/0876; H04N 21/43615
USPC .................................................. 382/181, 243
See application file for complete search history.

(56) References Cited

U.S. PATENT DOCUMENTS

| | | | |
|---|---|---|---|
| 5,475,512 A | 12/1995 | Nakazawa et al. | |
| 6,404,770 B1* | 6/2002 | Fujimori | H04L 12/40052 370/389 |
| 6,581,046 B1 | 6/2003 | Ahissar | |
| 7,624,085 B2 | 11/2009 | Hawkins | |
| 8,085,639 B2* | 12/2011 | Honma | G11B 20/10009 369/47.28 |
| 8,346,692 B2* | 1/2013 | Rouat | G06K 9/4623 706/20 |

(Continued)

OTHER PUBLICATIONS

U.S. Appl. No. 62/497,726, filed Dec. 2016, Kirch.

(Continued)

*Primary Examiner* — Jason C Olson

(57) ABSTRACT

Stimulation of sensors comprising an orthogonal x-y array, by abrupt edges or events, emits pulses that converge at nodes in serial two-dimensional (2D) arrays, which reemit rapidly if input pulses are in temporal synchrony. By gating sensors at a frequency with a wavelength between emitted pulses equal to the spatial interval between serial surfaces, identical pulses synchronize, or impedance match, repetitively at the serially repeated arrays. The pulses impedance match stimulated edges or events, as emitted one-dimensional (1D) z locations, continuously through aligned nodes in the serial 2D arrays, so that distal nodes that latently converge identical 1D z pulses become synchronous in time. This dimensional reduction of 2D arrays with synchronized 1D pulses, is a process that eliminates the coding, transmittal and decoding of information to reconstruct a 2D sensory pattern.

20 Claims, 9 Drawing Sheets

(56) References Cited

U.S. PATENT DOCUMENTS

| | | | | |
|---|---|---|---|---|
| 8,566,265 | B1* | 10/2013 | Cruz-Albrecht | G06N 3/049 706/27 |
| 8,878,579 | B2* | 11/2014 | Kurd | G06F 1/08 327/147 |
| 9,405,975 | B2* | 8/2016 | Izhikevich | G06K 9/00744 |
| 9,530,091 | B2* | 12/2016 | Hawkins | G06N 7/005 |
| 9,843,339 | B1* | 12/2017 | Kuan | G06F 1/04 |
| 2012/0308136 | A1* | 12/2012 | Izhikevich | G06K 9/00744 382/181 |
| 2013/0073497 | A1* | 3/2013 | Akopyan | G06N 3/063 706/27 |

OTHER PUBLICATIONS

Babadi, B. & Sompolinsky, H. Sparseness and expansion in sensory representations. (2014) Neuron 83:1213-1226.
Buzsaki, G., Logothetis, N., Singer, W. Scaling brain size, keeping timing: evolutionary preservation of brain rhythms. (2013) Neuron 80:751-764.
Chang, L. & Tsao, D. The code for facial identity in the primate brain. (2017) Cell 169:1013-1028.
Chicca, E., Stefanini, F., Bartolozzi, C., Indivieri, G. Neuromorphic electronic circuits for building autonomous cognitive systems. (2014) Proc. of the IEEE 102:1367.
Churchland, M., Cunningham, M., Kaufman, M., Foster, J., Nuvujukian, P., Ryu, S., Shenoy, K. Neural population dynamics during reaching. (2012) Nature 487:51.
Dean, H., Hagan, M., Pesaran, B. Only coherent spiking in posterior parietal cortex coordinates looking and reaching. (2012) Neuron 73:829-841.
Eyal, G., Mansvelder, H., De Kock, C., Seger, I. Dendrites impact the encoding capacities of the axon. (2014) J. Neurosci. 34:8063-8071.
Goodale, M., Pelisson, D., Prablanc, C. Large adjustments in visually guided reaching do not depend on vision of the hand or perception of target displacement. (1986) Nature 320:748-750.
Greschner, M., Bongard, M., Rujan, P., Ammermuller, J. Retinal ganglion cell synchronization by fixational eye movements improves feature estimation. (2002) Nature Neurosci. 5:341-347.
Gur, M. & Snodderly, D. A dissociation between brain activity and perception: chromatically opponent cortical cells signal chromatic flicker that is not perceived. (1997) Vision Res. 37:377-382.
Harvey, M., Saal, H., Dammann, J., Bensmaia, S. Multiplexing stimulus information through rate and temporal codes in primate somatosensory cortex. (2013) PLoS Biol. 11:e1001558.
Hung, C., Kreiman, G., Poggio, T., Dicarlo, J. Fast readout of object identity from macaque inferior cortex. (2005) Science 310:863-866.
Jackson, C. Woodwind design using microwave theory. (2001) IEEE Microwave Magazine 2(3):45-49.
Kara, P. & Reid, R. Efficacy of retinal spikes in driving cortical responses. (2003) J. Neurosci. 23:8547-8557.
Kaufman, M., Seely, J., Sussillo, D., Ryu, S., Shenoy, K. Churchland, M. The largest response component in the motor cortex reflects movement timing but not movement type. (2016) eNeuro. 3:e0085-16.
Kehoe, B., Berenson, D., Goldberg, K. Estimating part tolerance bounds based on adaptive cloud-based grasp planning with slip. (2012) 8th IEEE Intl. Conf. Autom. Science Engin. pp. 1106-1113.
Keopsell, K., Wang, X., Vaingankar, V., Rathbun, D., Usrey, W., Hirsch, J., Sommer, F. Retinal oscillations carry visual information to cortex (2009) Front. Syst. Neurosci. Epub. 3:4.3.
Lachaux, J.-P., Jerby, K., Bertrand, O., Minotti, L., Hoffmann, D., Schoendorff, B, Kahane, P. A blueprint for real-time functional mapping via human intracranial recordings. (2007) PLoS One, 2:e1094.
Laughlin, S. A simple coding procedure enhances a neuron's information capacity. (1981) Z. Naturforsch. C Biosci. 36:910-912.
Lecun, Y., Bengio, Y., Hinton, G. Deep learning. (2015) Nature 521:436-444.

Li, P., Field, G., Greschner, M., Ahn, D., Gunning, D., Mathieson, K., Sher, A., Litke, A., Chichilnisky, E. Retinal representation of the elementary visual signal. (2014) Neuron 81:130-139.
Maldonado, P., Babel, C., Singer, W., Rodriguez, E., Berger, D., Grun, S. Synchronization of neural responses in primary visual cortex of monkeys viewing natural images. (2008) J. Neurophys. 100:1523-1532.
Matias, F., Gollo, L., Canelli, P., Bressler, S., Capelli, M., Mirasso, C. Modeling positive Granger causality and negative phase lag between cortical areas. (2016) Neuroimage 99:411-418.
Martinez-Conde, S., Macknik, S., Hubel, D. The role of fixational eye movements in visual perception. (2004) Nature Rev. Neurosci. 5:229-240.
Mizuseki, K. & Buzsaki, G. Theta oscillations decrease spike synchrony in the hippocampus and entorhinal cortex. (2013) Philos. Trans. R. Soc. Lond. B Biol. Sci. 369:20120530.
Mizuseki, K., Sirota, A. Pastelkova, E., Buzsaki, G. Theta oscillations provide temporal windows for local circuit computation in the entorhinal-hippocampal loop. (2009) Neuron 64:267-280.
Mosquelier, T. Relative spike time coding and STDP-based orientation selectivity in the early visual system in natural continuous and saccadic vision: a computational model. (2012) J. Comp. Neurosci. 32:425-441.
Mukamel, E. & Schnitzer, M. Retinal coding of visual scenes—repetitive and redundant too? (2005) Neuron 46:357-359.
Osswald, M., Ieng, S-H., Benosman, R., Indivieri, G., A spiking neural network model model of 3D perception for event based neuromorphic stereovision. (2017) Sci. Rprts. 7:4070.
Parise, C., Spence, C., Ernst, M. When correlation implies causation in multisensory integration. (2012) Curr. Biol. 22:46-49.
Pitkow, X., Liu, S., Angelaki, D., Deangeles, G., Pouger, A. How can single sensory neurons predict behavior? (2015) Neuron 87:411-423.
Pouille, F. & Scanziani, M. Enforcement of temporal fidelity in pyramidal cells by somatic feedforward inhibition. (2001) Science 293:1159-1163.
Read, J. & Cumming, B. Effect of interocular delay on disparity-selective V1 neurons: relationship to stereoacuity and the Pulfrich effect. (2005) J. Neurophys. 94:1541-1553.
Reifenstein, E., Stemmler, M., Herz, A., Kempfer, R., Schreiber, S. Movement dependence and layer specificity of entorhinal phase precession in two-dimensional environments. (2014) PLoS One 9:e100638.
Reinagel, P. & Reid, R.C. Temporal coding of visual information in the thalamus. (2000) J. Neurosci. 20:5392-5400.
Roelfsema, P., Engel, A., Konig, P., Singer, W. Visuomotor integration is associated with zero time-lag synchronization among cortical areas. (1997) Nature 385:157-161.
Shiozaki, H., Tanabe, S., Doi, T., Fujita, I. Cortical activity in cortical area V4 underlies find disparity discrimination. (2012) J. Neurosci. 32:3830-3841.
Stanley, K. & Miikkulainen, R. Evolving neural networks through augmented topologies. (2002) Evolutionary Computation 10:99-127.
Sugase, Y., Yamane, S. Ueno, S., Kawano, S. Global and fine information coded by neurons in the temporal visual cortex. (1999) Nature 400:869-872.
Traub, R., Whittington, M., Stanford, I., Jefferys, J. A mechanism for generation of long-range synchronous fast oscillations in the cortex. (1996) Nature 383:621-624.
Tsunoda, K., Yamane, Y., Nishizaki, N., Tanifuji, M. Complex objects are represented in macaque inferotemporal cortex by the combination of feature columns. (2001) Nature Neurosci. 4:832-838.
Umeda, K., Tanabe, S., Fujita, I. Representation of stereoscopic depth based on relative disparity in macaque area V4. (2007) J. Neurophys. 98:241-252.
Van Ee, R. & Erkelens, C. Stability of binocular depth perception with moving head and eyes. (1996) Vis. Res. 36:3827-3842.
Varela, F., Lachaux, J-P., Rodriguez, E., Martineree, J. The brain web: phase synchronization and large-scale integration. (2001) Nature Rev. Neurosci. 2:229-239.

(56) References Cited

OTHER PUBLICATIONS

Wedeen, V., Rosene, D., Wang, R., Dai, G., Mortazavi, F., Hagmann, P., Kaas, J., Tseng, W-Y. The geometric structure of the brain fiber pathways. (2012) Science 335:1628-1634.
Zheng, Y., & Qian, W-H. Coping with grasping uncertainties in force-closure analysis. (2005) Intl. J. Robotics Res. 24:311-327.

* cited by examiner 10 msec of sensor stimulation results here in a 10 msec data stream.

The same 10 msec data stream transmitted over a longer distance.

Synchrony exists if any pair of identical pulses, emitted by the same stimulus edge at sequential times, are transiently positioned at proximal-distal locations at the same defined time.

A pulse time 1 above, in response to stimulation, is fixed as it moves; below, a latency proportional to the distance traversed accrues to 1 as a 'micromemory' while a new 2 fixed time emits.

Synchronous x-y stimulation at '2' loses 2D location tags when convergent pulses reemit at '1' as 1D z pulses.

SYNCHRONOUS CONVERGENT PULSES REDUCE DIMENSIONS OF SERIAL SURFACES

RELATED APPLICATION

This application claims priority under 35 U.S.C. Sec. 119(e) of Provisional Application 62/497,726, filed Dec. 1, 2016, which is hereby incorporated by reference, in its entirety.

FIELD OF INVENTION

Telecommunications, Neural Networks, Variable Frequency Oscillator (VFO), Phase-Locked Loop (PLL), Sparse Code, Parallel Processing, Brain-Machine Interface (BMI), Robot Grasp, Pattern Recognition.

BACKGROUND OF INVENTION

Information theory formalizes methods to parse an image into binary bits for coding and transmittal between locations. However, this can require sophisticated algorithms to encode, decode, and store the data over time. For example, a color sensor in a television camera responds to variations in light intensity with a continuous stream of bits that encode stimulus intensity at sequential times as encoded binary information. This sensor output is also multiplexed with the information from other color sensors to reproduce the hue in each pixel in the decoded image. Error correction built into the coding algorithms ensures that noise that corrupts specific bits of transmitted information is corrected when decoded onto a 2D screen.

An organismal visual system seems to have a form of sparse coding because the rate of spikes generated at a sensory surface like the retina, reduces at successive synaptic stages, from the retinal ganglion cells (RGCs) to the lateral geniculate nucleus (LGN) and in individual cells in subsequent areas such as V1 and inferotemporal (IT) cortex. This reduction in maintained spike firing rate, as neurons spatially converge sensory inputs into cortical perceptual areas that each have larger receptive fields, (RFs) with increased numbers of cells, has been found true for sensory systems in general. Some have interpreted this reduced cellular spike rate, due to spatial and temporal summation at serially convergent synapses, as multiplexed data, in a hypothetical temporal or latency code in neurons. Others have presumed that the repetitive information in an image is coded sparsely, with algorithms to decode, or reconstruct, the image from the compressed information. In an effort to copy the nervous system's economy of information transfer, neuromorphic chips condense binary coded information into packets that are time-multiplexed, with each packet time- and origin-stamped and addressed to specialized processing units. This avoids the congestion of information at a central processing unit, known as the von Neumann bottleneck, analogous to retinal convergence, in which photoreceptors spatially converge on RGC neurons in an approximate 60:1 ratio in primates, before fanning out in an approximate 1:350 ratio of LGN neurons:V1 neurons. The apparent analogies between neural and computational systems are used in other models to code, transmit and decode still images from a sensor surface to a location that performs cognitive functions upon the information in the image. The nervous system is conventionally interpreted to take 'snapshots' of successive visual images with each shift of the retinal surface during fixational eye movements, but these images, in order to be stored in memory, have to be sparsely coded to conform with presumed anatomical and actual electronic coding limitations. These previous interpretations are only a partial use of the neurophysiological evidence and inevitably conmingle information theory with experimental data in a way that does not resolve relevant issues meaningfully but creates more confounded complexity. Massive experimental data supports neural spike synchrony as a mechanism that binds perceptual processing of sensory input and communication between cortical locations. However recent analysis in reputable labs shows that little information is transmitted or communicated between neural locations in the synchronized or phase-locked state. Embodiments that use this synchronization of locations as an alternative to information transmittal by temporal coding between locations are the subject of this invention.

One prospective embodiment would improve 3D stereovision goggles used in virtual reality, which synthesize binocular stereo imagery from algorithms that compute the information of monocularly changing imagery but without precisely correlated temporal synchrony, which creates dizziness and vertigo in the wearer after a short time. Another embodiment improves accuracy of a robotic grasp as a target nears, which presently has feedback delays, causing inaccuracy and blurring when the target image is repetitively reconstructed from updating information at a central processor.

In a similar vein, conventional machine or deep learning algorithms repeatedly cycle streams of temporally coded image information, comparing false positives with previously learned image templates, to incrementally learn from the repetitive feedback to probabilistically recognize a spatial pattern. This repetitive cycling of temporally coded information through layers of connections takes substantial time and computational resources. Given that neurons in a synchronized state do not transmit information, the following invention describes several embodiments that are more efficient than the conventional transmission and cyclic feedback of temporally coded information.

OVERVIEW

Here pulses (analogous to spikes in neurons) transduce the detail of peripheral edgestimulated information, which impedance matches at a synchronization frequency, aligned and convergent nodes (analogous to synapses in the brain) in serial 2D surfaces, layers or arrays of neurons (these terms are used synonymously here). Therefore no 2D x-y information is temporally encoded, or multiplexed, by pulses to a distal location to be read out or decoded, but identical pulses constitute an impedance matching z dimension that repetitively integrates serially aligned surfaces via the frequency or rate of pulses emitted by stimulus edges at the initial sensory surface. In the invention described here, packets of information or spikes, are replaced by pulses in electrical circuits, which integrate, via the third dimension z, proportional increases in both location and time. A z pulse is defined here as equivalent to a single spike or a group of rapidly repeated spikes that are limited, or phasic, in duration. Pulses move when stimulated at a specific time by a specific stimulus, such as an image edge at a sensor, corresponding to an edge or 'event' detector. A condition of the existence of the z pulse is that it is not stationary, or a store of static information, but travels at a relatively constant speed, near the speed of light or of electrons, over the wired, linked or connected (used interchangeably here) distance between aligned nodes, organized orthogonally as serial 2D surfaces. A node here is equivalent to a simple TTL (transistor-transistor logic) or CMOS (Complementary Metal Oxide Semiconductor) or FET (field effect transistor) gate or component, or any other components (such as a CCD light sensor or pixel, FPGA or ASIC circuit) with a hardwired or programmable function as an edge, moving event or coincidence detector, reemitting a pulse only when its input or most or all of its multiple spatially convergent inputs are temporally synchronized, reemitting a pulse within a specified integration period or window of time. Similar to resonant microwave or acoustic cavities, z pulses synchronize serial 2D surfaces that reiterate the topography of the initial emitting surface; at any instant, these moving z pulses are at a proportional distance and latency as they traverse each serial 2D surface. If sustained pulses are at a sufficient speed and have a minimal spatial interval between pulses at least equivalent to the distance between nodes in encompassed 2D surfaces, the synchronization of proximal-distal surfaces at the pulse frequency occurs with little or no phase lag. As shown experimentally, this phase lock occurs much faster than the transmission delay of a single spike between two neural locations, so requires at least two identical moving pulses as a synchronizing context. The repetitive movement of parallel z pulses at a preset or programmed frequency, coordinated with the z distance between serially aligned nodes, temporally synchronizes emitted and reemitted pulses between those linked nodes. The resonant frequency is caused by the reemission of z pulses, at a pulse repetition rate synchronized with the time delay required to travel the distance between and summate at connected nodes in the topographically matched surfaces. Identical 1D z pulses act as a transiently repetitive third dimension, so in the present invention do not temporally code or multiplex information in any binary or other coding scheme such as used to stream data. This mobile z dimension, constituted of identical pulses at a specific rate or frequency, integrates linked nodes regularly spaced in repeated 2D surfaces as a periodically stable structure during synchronization. If at a sustained rate from the same edge, the pulses are in effect and actuality, identical in time and information content, even though each individual pulse is sequentially generated, due to the emergent context of identical multiple z pulses repeatedly present at linked nodes at the same transient repeated times in serially repeated 2D surfaces. The time required to synthesize proximal-distal 2D surfaces is not dependent on the quantity of information at the 2D sensor array that could be encoded and transmitted as bits in a connected wire as in conventional systems, but depends instead on the gating frequency that synchronizes the periodic emission of pulses from the edge-responsive sensors or nodes in the initial 2D surface. Generally, the synchronous timing of z pulses that spatially converge at nodes in any 2D array reemits pulses at a frequency that synchronizes with the distance and latency to the next 2D surface. Because the synchronized pulses at any distal location are reemitted from specific edges or events at specific x-y locations in an initial surface, identical pulses that distally reemit, while not multiplexing temporally coded data, are the displaced, temporally synchronized, z locations of the actual edge information that stays at sensors or the initial nodes. Corresponding to the coordinated match between the minimal length of the fixation period and the length of the perceptual moment (in the 150 msec range for both) in human vision, the emitted times for sustained, identical z pulses elicited by simultaneous spatial patterns of edges that stimulate a sensor array, travel the distance from the sensor surface to terminal nodes to synchronize the proximal temporally sustained response with the latency of pulses at the distal nodes. The sustained time of pulses emitted by a specific edge pattern is a limiting time for dimensional reduction of the serial surfaces to an equivalent 2D surface at any instant of repeated z pulse emitted times. But the quantity of detailed proximal information that is synchronous at any instant of the shifting or gating frequency at the sensor or initial x-y surface, is not defined or limited by bandwidth or transmitted bit rate over proximal-distal distance during the synchronized state. During the synchronization of z pulses sustained at a rate or frequency by a stimulus edge pattern or moving event, linked nodes in serial 2D surfaces, at approximately the same spatial interval or wavelength as the synchronized, emitted temporal interval of parallel z axis pulses, are periodically at the same objective instant of z time when viewed orthogonally. The synchronous times of the moving z 1D pulses repeatedly unite the serial 2D surfaces as identical x-y-z dimensions or 3D locations at the resonant frequency, which does not require proximal information to be temporally coded and decoded at a distal location.

Given that the filled area and edges of connected shapes emit area-synchronous z pulses, at temporal intervals that coincide with the travel time of the synchronized pulses to the next in serially linked nodes in 2D surfaces, the identical emitted and reemitted pulses are at repetitive locations timed at frequencies corresponding to the distances and latencies between specific nodes linked serially in 2D surfaces. If there are no stimulated edge crossings in any shift-cycle of the sensor array, no synchronized z pulses emit for that cycle. However a detailed, complex image emits many simultaneous z pulses in any cycle of the gating frequency; it is possible to modify somewhat the gating frequency in response to stimulus intensity to increase precision, or to modify the amplitude of each cycle to alter the precise sensor response to edge contrast. Microwave design theory provides a basis that impedance matches the distance between 2D cross-sectional surfaces with the inversely proportional frequency generated or emitted at an initial surface. Here, distance between specific linked nodes arranged in regular arrays in serial 2D surfaces, not information density, bit rate or bandwidth capacity, governs the z frequency over that linked distance. Amplitude or frequency modulation, or phase differences of the same or similar frequencies, which in prior art are used to code information, are not used here because informational stimulation impedance matches edge or event detection at the periodic gating x-y frequency with each spatially and temporally synchronous summation at a linked node, which reemit z pulses that individually integrate proportional location and latency.

The initial conjunction of edge stimulation with orthogonal sensor frequency synchronizes or impedance matches the periodicity between edge-generated pulses and the proportional wavelength or latency to specific linked nodes in serially distant 2D arrays. Conventionally, PLLs correct via feedback of measured phase differences, the phase-locked frequency specific to the distance between two locations. In the invention here, the resonant frequency between connected nodes is not corrected, because the resonance is due to spatial and temporal synchronous summation of edge-generated pulses that reemit in phase at perhaps just one node in an array; phase-locked synchrony varies with the pulse latency and speed between specific linked nodes in a population of variably responsive nodes. A coincidence detector, also called a convergent node here, responds most rapidly to temporally synchronized inputs, from equidistant input nodes. What are conventionally measured in neurophysiology at an unmoving electrode location as phase differences, which are aggregated to obtain an average spike frequency, are here, specific phase-locked frequencies tuned to specific z distances between specific nodes.

The periodic synchrony of moving, identical z pulses is an intrinsic feedback mechanism that impedance matches the repeated emitted time of sustained pulses at a gating frequency with subsequent, selectively reemitted latent times of identical z pulses at distally connected nodes in serial 2D surfaces. Synchrony can also result from recurrent feedback of convergent pulses emitted from a serial 2D surface to nodes in a previous input surface. Proximal-distal integration of 2D serial surfaces by z pulses requires a change of mindset from information transfer in a temporal code of binary master-clocked pulses to one of impedance matching by a third dimension of emitted z pulses that synchronize at nodes with summated reemission times, in which the least-time maximal response synchronizes proximal nodes with linked distal nodes. This requirement for a mobile z dimension to transiently integrate linked nodes in repeated 2D surfaces when temporally synchronized, without transmitting peripheral information centrally, is consistent with physical law.

This theory of operation based on the physiological brain that uses dimensional resonance rather than information transfer, requires prior embryonic development and definition of specific anatomical routes, which are important for the specialized stages of visual function, as shown by the neural convergence and divergence to the various quantities of cells specific to each stage of RGC, LGN, V1, V2, V4, IT . . . of the visual system (a schema of these serial stages is shown in FIG. 2). Space constancy, binocular fusion, robotic reaching, size constancy for object identification, and location constancy (convergence from any part of the visual field) use variants of neural circuits that converge and diverge in specific configurations in each layer of nodes in serially linked arrays and the regular anatomy of the cerebellum. Each synchronized stimulation of pulse emissions synergizes with the spatially convergent circuits specific to each serial array of nodes that proximally-distally synchronize z pulses emitted by informational edges during the sustained fixation period. This orthogonal transformation of synchronized x-y input to a specific z synchronous dimension requires 2D time plots (on a 2D page) or 3D time if physiologically veridical (corresponding to three spatial dimensions), as detailed in the description and figures that follow.

BRIEF SUMMARY OF INVENTION: In one aspect of the invention, repeated, serially aligned 2D surfaces dimensionally reduce to a single periodic structure, enabled by a third dimension of z pulses moving in wired or connected links between the serial nodes. Sustained, identical z pulses are timed at intervals that transiently position the moving pulses at each linked node in each 2D surface at the same time (FIG. 1). While it seems inefficient to time pulses according to the distance or latency to nodes in the next serial array rather than transmitting at a high bit rate (FIG. 1A), it is required so that the same sustained, repetitive, gated pulse time is present at proximal sensors as is present and transmitted to the distal location (FIG. 1B). The increase in efficiency results because temporal proximal-distal synchrony does not require transmittal of the sustained proximally precise bits of information of the stimulated edge pattern to the convergent distal location. The wavelength between synchronized pulses has to match to the approximate distance, or a harmonic multiple of the distance, between connected nodes (FIG. 1C); also the pulse latency has to match with the average speed (or distance/latency) required to transmit and summate the pulses in serially linked nodes in serial array networks.

The synchronized context of sustained identical pulses is stimulated by connected object edges and the encompassed area, which impedance match the dimensional reduction by identical z pulses spaced at a wavelength that approximates the distance between static x-y nodes, so that pulse rate synchronizes, at the same objective clock time, serially connected nodes. The advantage of this aspect is that the encoding and transmittal of information over the encompassed distance is not required, nor is correction of bit errors, which are filtered out as noise at each synchronously reemitting node. Because the image is not reconstructed distally but is a synchronization of the emitted x-y time at proximal sensors with the reemitted, convergent z pulse time at a terminal node, sensor information is not proximally coded or distally decoded. While synchronization requires the sustained existence of proximal edge-emitted pulses to synchronize with distal pulses from the same edge, this coordination of planar x-y time with sequential z time creates incremental spatial and temporal precision of a moving edge (FIG. 6), in addition to the synchronized precision of the pulses sustained over time by the presence of an unmoving shape of connected edges during binocular fixation.

In another aspect of the invention, the fixed time of pulse stimulation is retained by the proportional location/latency of the moving z pulse at any elapsed time after stimulation. The survival, or memory, of any z pulse over an elapsed time and distance requires temporal and spatial synchronization of identical z pulses that rapidly reemit at serially convergent aligned nodes; this periodic reemission also synchronizes sustained z pulses proximally-distally. The temporal synchronization of identical pulses proximally-distally retains the fixed pulse emission time (FIG. 3A), by the proportional change in position of this fixed time when temporal synchronization rapidly reemits at spatially convergent nodes at proportional distances. By moving at the same speed as similar pulses from a proximal surface, at a synchronized frequency or pulse rate, the sequential position and latency of the pulse in relation to the sustained train of pulses is maintained. The retention of a fixed emission time by the same pulse that rapidly reemits at a distal node does not require the coding or storage of each fixed emitted pulse time as a static binary-coded memory, but is maintained by information-identical pulses emitted by the same stimulating edge(s).

In a third aspect of the invention, the z dimension, responding to feature-specific sensor information, changes location a proportional distance according to a gating frequency, or sustained pulse rate, generated at a sensor surface. A slower pulse rate or frequency is required to stimulate a more distal node because the longer distance requires a longer latency for pulses to summate and synchronously resonate from the distal node. The distal node may recurrently reemit pulses as feedback on a previous emitting node to temporally synchronize emission with reemission pulse timing intervals, or to synchronize the fixed emission time with the elapsed latency that results from the delay caused by the pulse speeds and summation times between resonating convergently linked nodes. The emission rates or frequencies at initial feature-selective nodes generate the synchronized z pulses that move the z dimension to spatially convergent serial nodes, which integrate combinations of peripheral feature responses. The spatial and temporal convergence of feature-selected (edge-generated) pulses at repeated, convergent nodes synchronizes the proximal feature pattern corresponding to the sustained stimulus presence, with distal, latent z pulses, which least-time converge parallel reemitted z pulses to ultimately, a single synchronized z dimension. The sustained repetition of identical z pulses proximally-distally, allows the x-y locations and timing of the synchronized proximal stimulus to transiently but repeatedly synchronize distally, without temporally coding proximally detailed x-y information to be distally decoded from a 1D data stream that reconstructs the spatial detail of the stimulus image.

In an embodiment for a reading apparatus, feature selective nodes respond to specific x-y spatial patterns of inputs, corresponding to letters, that upon convergence of the spatial pulse pattern upon an equidistant node within a limited temporal window, reemits a z pulse in response to the specific word signaled by the letters. This occurs in repeated stages of spatial convergence, with succeeding reduced pulse frequencies, until a node in the last array reemits z pulses that temporally synchronize with the sustained pulses emitted by the proximal spatial information. The z pulse rate at the nodes in the last array is too low to convey the proximal spatial sentence information. Instead, because a reemitted z pulse at a distal node temporally synchronizes with the sustained x-y mapped, identical pulses still present at the peripheral sensor surface, the synchronous proximal-distal time, via repeated z pulse fixed times, integrates the serial abstractions that result at serially connected 2D arrays. The rapid shifting of peripheral information during reading does not require specific responses by specific distal nodes to specific letters and words; generic categorization responses that converge in least time to a specific terminal node synchronize with specific stimulatory letters as they change. It is the proximal-distal synchronization of identical pulses gated by a repetitive orthogonal sensor array frequency, with proximal sensors specifically responsive to rapidly changing letter information, at a distal node (of many possible nodes), of which one local cluster responds in least time to 1D z pulses, which creates recognition and emergent abstract meaning of the proximal letter pattern.

The above embodiment is only one of many possible for recognition of any spatial pattern of inputs. Other embodiments relevant to the synchronization of z dimension pulses without the encoding or transfer of bits of temporally coded information are described in the detailed description of this invention but are not limited to the examples given.

A preferred embodiment for a categorization and identification device of stimulus objects or shapes, uses the synchronous emission and reemission of pulses to synchronize proximal stimulus specificity with a latent distal categorization, based on a convergent path of stimulus edge-generated pulses that converges most rapidly on a specific terminal node, among many possible (FIG. 2, 2A, 2B, 2C, D). Successive convergent nodes respond to equal pulse transit times and distances traversed from nodes in the previous layer of from the initial sensor surface, which synchronizes, by reemitted pulses, successive 2D surfaces at the fixed gating frequency or a multiple thereof, of the initial sensor array. This least-time path does not require the cyclic repetition of feedback information between nodes in repeated layers or arrays to learn or identify the peripheral stimulus pattern over time. The association of the pulses emitted by a proximal specific edge-pattern with distal recognition, by least-time reemitted pulses to a specific terminal node, is shown by analyzing time, embodied in moving z pulses, into emitted, latent, synchronous and sequential contexts on the same 2D time plot (FIG. 4A, 4B). These intrinsic time properties do not code, transmit and decode information that reconstitutes a stimulus representation at a distal location, or is repeatedly cycled in temporally coded streams for algorithmic analysis of stimulus information.

Another embodiment provides for synchronous coordination of a robot hand reaching toward and grasping a recognized target (FIGS. 6, 7). The analysis of time into components is a part of the method of this invention that eases the comprehension and display of increased precision and reduced latency of response near the target, which does not require looping delays of informational feedback. This is an advantage over the current technology of target grasping that becomes less precise due to information feedback delays near the target.

BRIEF DESCRIPTION OF DRAWINGS

FIG. 2 A) Synchrony exists if reemitted pulses are concurrent with newly emitted pulses from the same feature pattern. 1D z pulses that rapidly reemit at serial nodes synchronize at frequencies (or harmonics thereof) with wavelengths that approximate the distance between two given nodes.

DETAILED DESCRIPTION OF THE INVENTION

Theory of Convergent Synchronization Based on the Brain's Mechanisms

Figure 6:
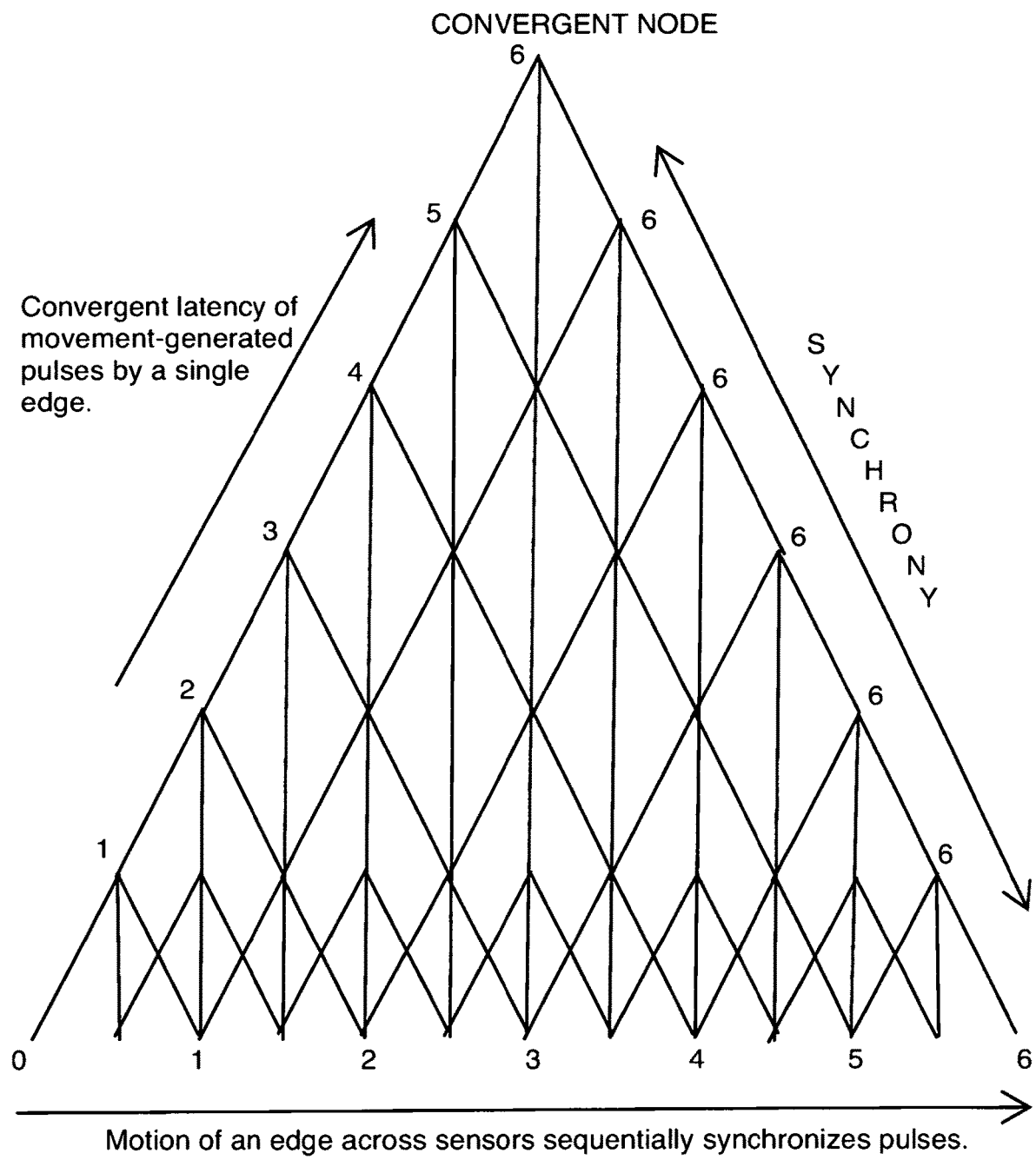
FIG. 6) A moving target edge progressively synchronizes pulses from a sensor array, which also synchronizes temporal and spatial precision at sensors with a distal node response to the target edge.

Embodiments of the present invention are now described in more detail; in concert with the figures, they enable those skilled in the art to execute the invention. The descriptions of convergent circuits in serial arrays that follow, take advantage of the synchronous timing characteristics of periodically emitted pulses, caused by the clocked orthogonal frequency of a sensor array, in which pulses are transmitted a linked distance to nodes in periodic, serially aligned 2D arrays. The sensor array can consist of multiple layers of different types of sensors or edge detectors or other types or forms of transitory event detectors. Pulses stimulated by object edges emit according to the orthogonal shifting frequency of the sensory surface, or of a shifting screen adjacent to a non-shifting sensor array, with an amplitude sufficient to elicit a signal from individual sensors or elements, or has a fixed transmittal rate (in Hz) of CCD, CMOS or TTL gates in an array, or any other sensor assembly, or a camera with a gated frame rate or serially timed exposures. The serially synchronized pulses emitted by the sensor array, stimulated by specific feature shapes (65 and 80 in FIG. 2), converge via links to serial nodes that individually respond to both a specific feature pattern (FIG. 2D) or the movement of a stimulus event across sensors (FIG. 6). The shape of the stimulus, if composed of linear aggregations of points (70 and 85), stimulate oriented edge-responsive sensors in the first array (100). These linear patterns of stimulated sensors emit temporally synchronous pulses to convergent serial nodes (86, 87, 88) in serial arrays (110, 120, 130, 140), which serially filter, or dissociate the oriented features (65, 80), or dimensions, of the integrated 2D spatial pattern into 1D z pulses emitted by feature dimensions that are filterable by spatially convergent nodes. Because of the serial increase in filtering selectivity of convergent nodes in serial arrays to impinging temporally synchronous pulses, pulse outputs reemit most rapidly in convergent 1D z axes, routing to very selective nodes in the last array (89). This least-time routing does not require any temporal code, latency code, or incremental adjustment of synaptic weights to bias pulses onto a specific path over many trials. But the 1D z pulses that converge most rapidly to specific nodes in the last array (150) due to an adjusted parameter (415, 420 in FIG. 2D), survive to give a latent recognition of the concurrently sustained pulses emitted by a stimulus pattern at its x-y sensor array locations (100). The external 2D information at the sensor array (100, 170) is not coded by serially reemitted 1D z pulses that converge to nodes in the last array (150, 190), so variable 2D stimulus size, location and orientation information is filtered out by initial nodes in serial arrays.

Figure 2A:
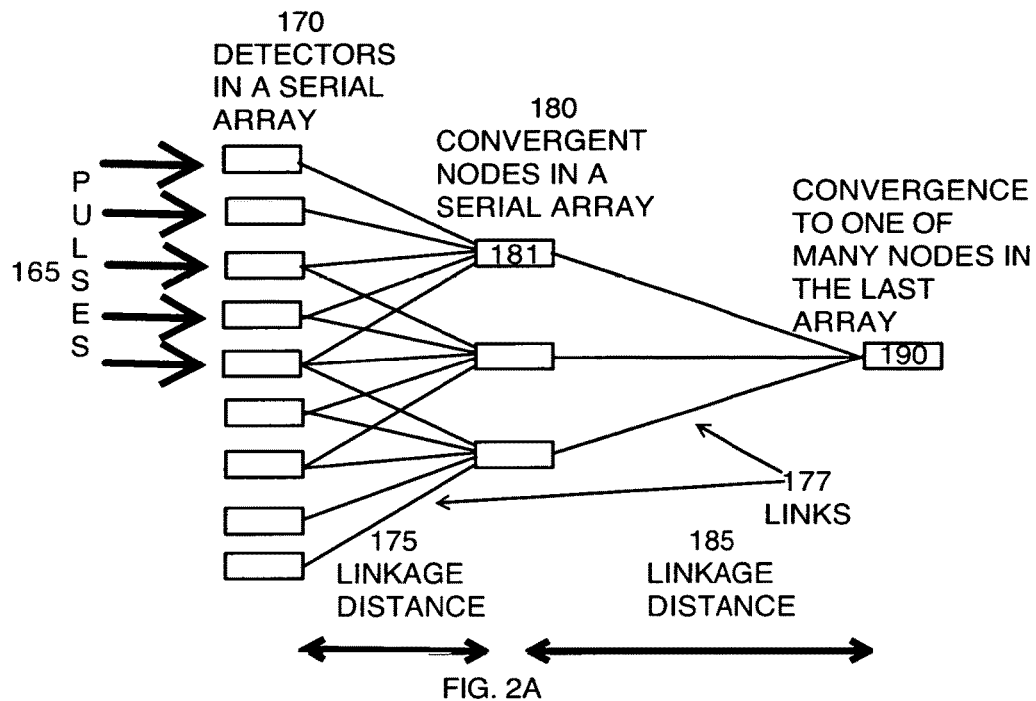
FIG. 2) This neural net composed of nodes in serial arrays, selectively propagates signals that temporally synchronize at any given node. A specific distal node responds fastest to a dimension filtered by temporal and spatial pulse synchrony from any multidimensional stimulus location. Serial convergence of output 1D signals at serial nodes selects a few nodes of many nodes in the last array.
FIG. 2B) Temporally synchronous monocular pulses emitted by the same dually mapped edges of a feature pattern, reemit from binocularly convergent nodes at a frequency and wavelength approximating the distance and latency between serial arrays, for sharp 3D depth resolution.
FIG. 2C) Edge patterns stimulate sensor types that converge outputs from specific edge orientations to initial nodes. The temporal synchrony of pulses emitted by a stimulus edge, or from an edge pattern, converge in multiple input links that summate at initial and subsequent nodes, which reemit serially selective 1D pulse outputs.
FIG. 2D) The 2D properties of the stimulus, such as its area, stimulus location in the sensor array and orientation, filter out in the serial 1D z outputs. The selective reemission of serial 1D z pulses is adjustable. The fastest pulses to nodes in the last array, which identifies or recognizes the stimulus or its category, are concurrent with sustained pulses emitted by initial locally stimulated nodes.
Figure 2B:
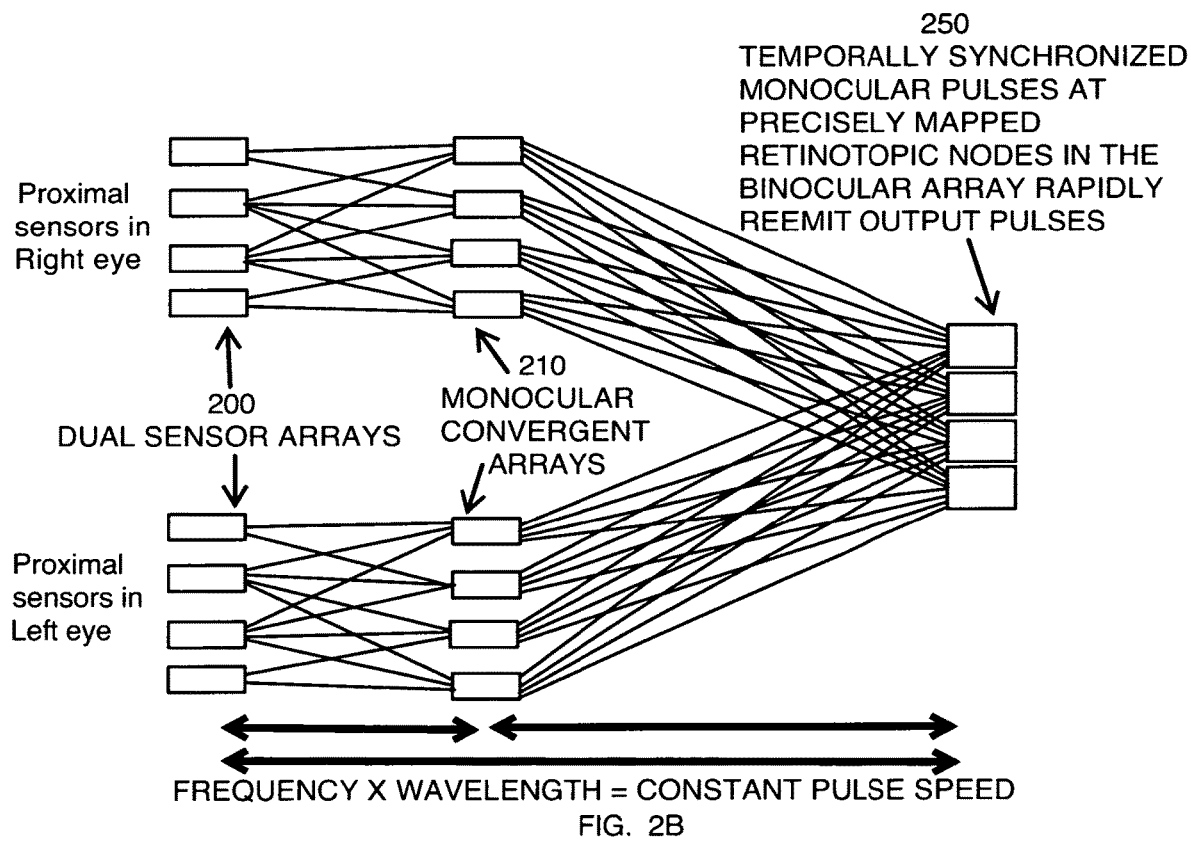
Figure 2C:
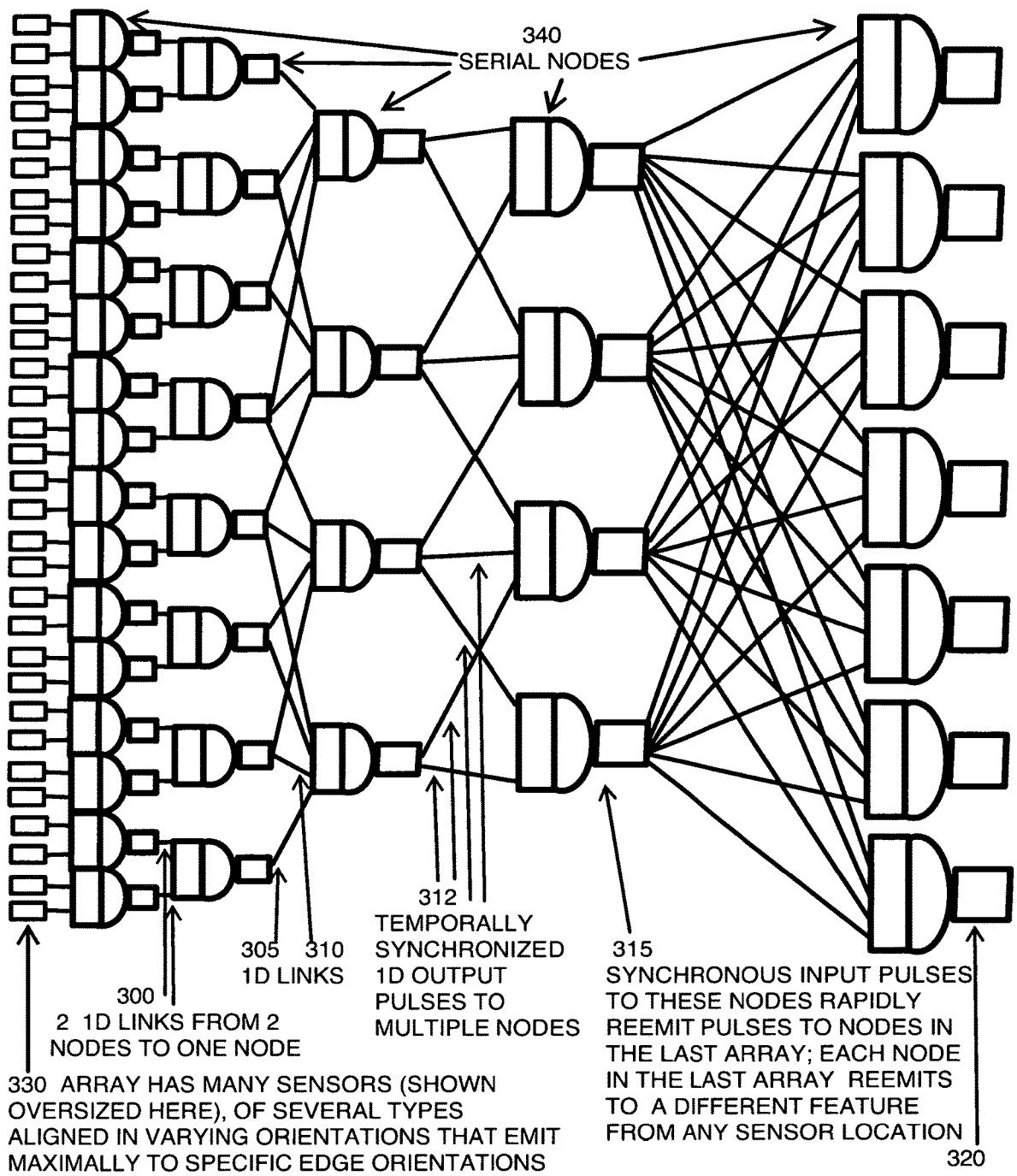

A given serial node (190) responds maximally to pulses emitted by a specific feature pattern (65, 80, 165), due to the selective linear orientations of sensors (170) and serial intermediate nodes (180), which reemit faster due to larger numbers of pulses that temporally synchronize at a given convergent node (181,190). While this fast response is due to convergent input pattern topography at early and intermediate nodes, it is also adjustable and configurable at an interface (420) to select output pulse rates and frequencies as shown in (340) that make up repeated cascades in serial arrays of nodes (FIG. 2C). The separable properties of the 2D x-y location, size, and orientation of the same stimulus feature pattern, are not transmitted by serially convergent pulses, which reemit at reduced rates and frequencies, ultimately converging to a stream of rapidly emitted 1D pulses common to identical stimulus features. The specific stimulatory feature pattern (65, 80) sustains pulses that reemit at maximal rates by specific nodes in the last array (320), which respond fastest to temporally synchronous pulses reemitted through the serial arrays. The x-y locations of sustained pulses generated by the sustained presence of the feature-connected edges of a pattern at any 2D location (330), or a moving edge event at sequential sensor locations (FIG. 6), is temporally synchronous with pulses reemitted from the last array (320). Therefore, 1D z axis pulses (300, 305, 310, 312) that selectively propagate to converge at a few nodes in the last array (320) have 2D information filtered out by rapidly reemitted pulses through serial nodes; these 1D lower pulse frequencies, with longer intervals between pulses to accommodate the increased distance and latency to the selective last nodes (FIG. 2A), is not multiplexed information, but is temporally synchronous with concurrent pulse frequencies emitted by sensors and initial nodes (330) by the specific stimulus feature patterns and moving events at any 2D location in the sensor array (FIGS. 2A, 2C, 2D, 6).

Figure 2D:
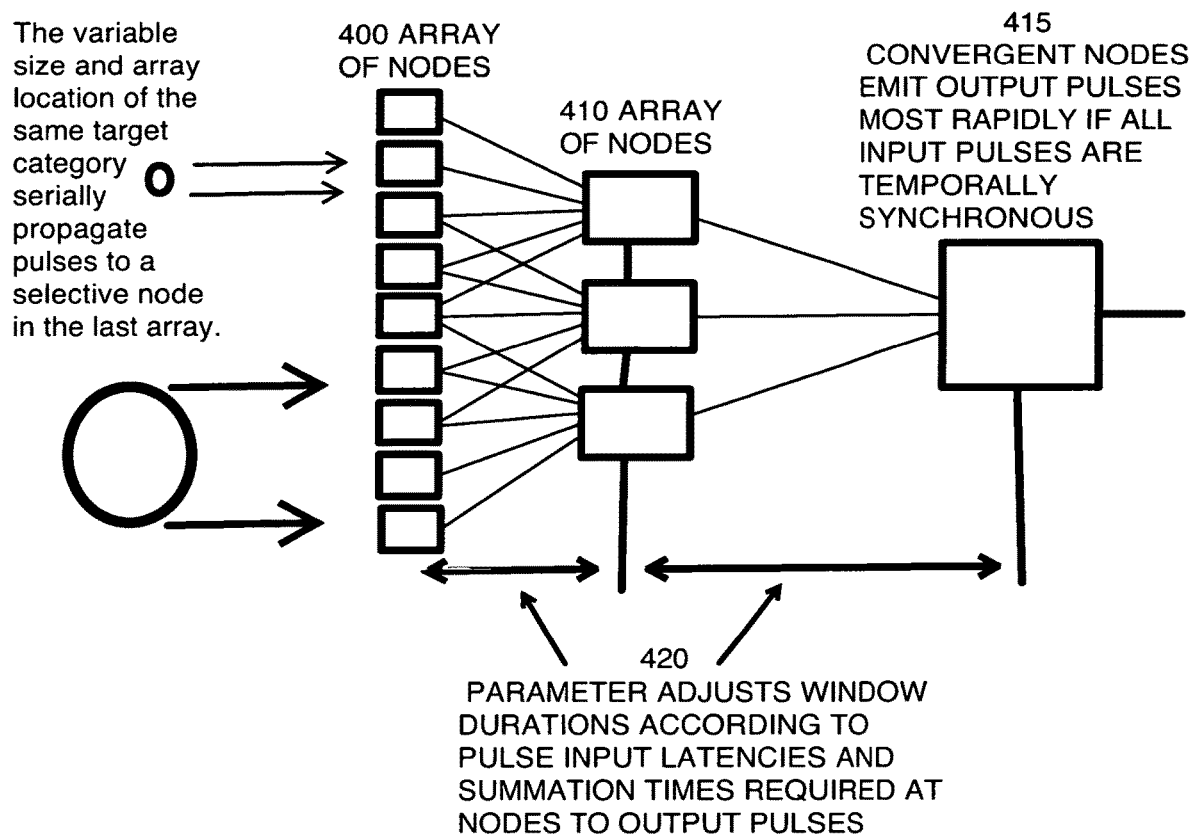
Figure 3A:
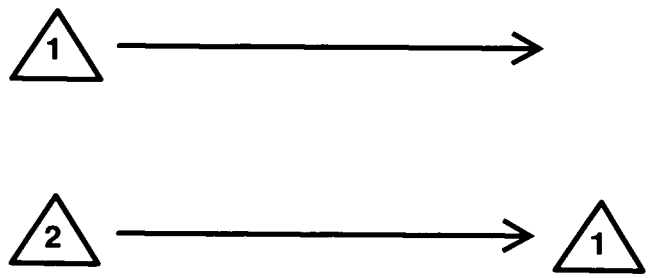
FIG. 3A) The emitted time of a stimulated z pulse is fixed as it moves to distal locations. This fixed time is a 'micro-memory' of the stimulated event, since it also acquires latency with distance.
Figure 3B:
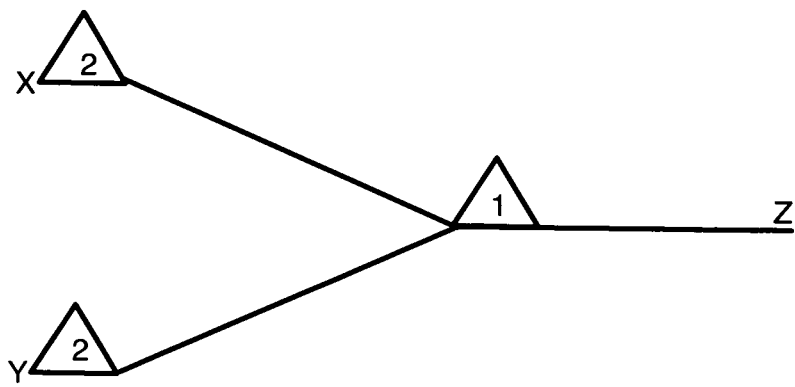
FIG. 3B) A stimulus area's x-y edge pattern emits temporally synchronous pulses at '2' that converge at a serial node '1' to reemit 1D z pulses. This serially sustained process illustrates that 1D z pulses do not multiplex x-y information, but reemitted 1D z pulses temporally synchronize with 2D fixed time pulses locally mapped at sensors.

That the high dimensionality of peripheral information and high pulse rates emitted at sensors serially impedance match, due to convergence of pulses at nodes into a single z dimension of synchronous time, is shown in simplest form in FIGS. 2D and 3B. The specific two dimensional properties of the stimulus, including its size, location and orientation, are filtered out by convergent temporally synchronous pulses at nodes in each serial array that output reduced rate 1D pulses (FIG. 2C; 300, 305, 310, 312). Exemplary embodiments are shown; here a multiple-input node (300, 305, 310) in an array (340) reemits a 1D output only if all inputs are stimulated at the same time; a 3 input node (315) reemits slowly if only one input presents, more quickly for 2 sequential inputs, and rapidly as soon as the third input presents (415). This makes the convergent node (410, 415) less sensitive to smaller size of the stimulus and relatively insensitive to specific sensor locations (400) of the convergent inputs to a given node. The fastest summation by given selective nodes (FIG. 2D), routes the fastest pulses emitted by a specific feature pattern, through selective nodes to specific nodes in the last array (315, 320, 415). The input feature pattern geometry that is selected by a given node (330) emits higher rates of pulses that remit more quickly to intermediate serial nodes (340) and to a few nodes in the last array (320), but more slowly to neighboring nodes in any serial array. The few nodes in the last array with the highest rates of reemitted pulses have higher fixed time pulse precision to the recognized (by maximal pulse rates) feature pattern.

In conventional binary coding of an image feature, feature information is converted to bits, which increase precision with increased length of the bit string. Here, the topography of sensors in an array that converge to a given node, emits high pulse frequency when the edges of a feature or pattern match the orientation of sensors that converge on initial nodes (102), with increased accuracy and precision of the match causing higher reemitted pulse frequencies. This edge detection is one of several responses by the initial sensor types (100); the topography of initial sensors may also respond to various lengths of edges and varying features and patterns, with varying sensor responses due to gray areas or other scaled qualities. The topographical organization of convergent sensors varies the responsiveness of convergent nodes to specific stimulus features. Any variance in latency of pulses is eliminated by the 2D sensor array frequency required to temporally synchronize pulses at convergent serial nodes for reemission (FIGS. 3B, 4B). The pulse frequencies require intervals between pulses at least the minimal latency required for pulses to summate and to travel the linkage distance from nodes in a previous array (indicated by arrows at the bottoms of FIGS. 2A and 2B). Pulse frequencies phase-lock during sustained stimulation; the pulses are transiently present at proximal-distal serial nodes along a given linked z axis (FIGS. 4, 5), at any instance of incremental time during concurrent sensor stimulation. The specific edge-emitted times, periodically synchronize when rapidly reemitted by each serial stage of spatially convergent nodes (FIGS. 2C, 2D) or similar coincidence-detecting nodes. The stimulation time of an emitted pulse ('1' in FIG. 3A) is preserved by movement of the fixed emission time from the stimulation site; the increase of latency over increased distance of a moving pulse retains the initial emitted time as older in time (shown as '1' at the bottom of FIG. 3A). This retention of emitted times by pulses, reemitted rapidly but later in time and distance on z axes, are here called 'micromemories'.

Figure 2:
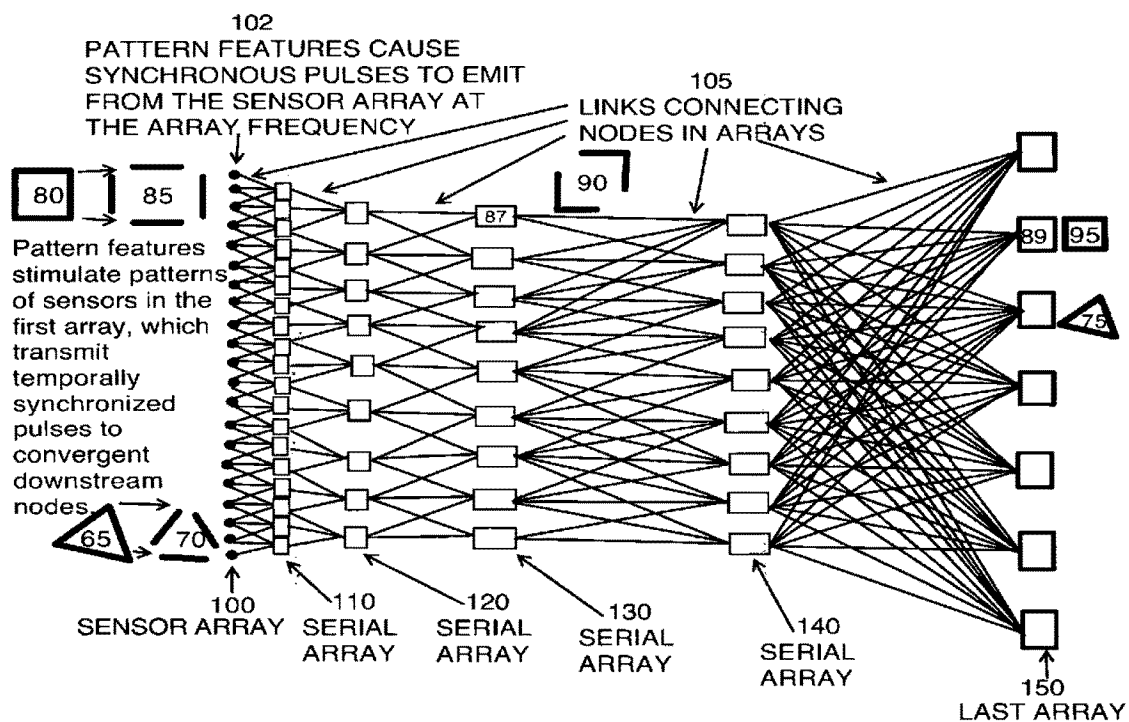

At each serial 2D array, equidistant, approximately equally-timed pulses randomly converge to specific nodes in that serial array; if a sufficient number of pulses impinge on a given node, it reemits pulses, which are temporally synchronous with pulse outputs (from the same stimulus) concurrently emitting from a previous serial array (FIG. 4B). Nearby convergent nodes in the same layer that are not equidistant from previously stimulated nodes, may not have equally timed, synchronized pulse inputs from a peripheral stimulus pattern, so do not rapidly reemit pulses in phase with the orthogonal sensor array frequency (FIG. 2B, 2C). A conceptual insight is required to understand that successive pulse emitted times (micromemories) from the same stimulus edges, synchronize z times proximally-distally without transmitting encoded image information to a distal location to reconstruct the 2D image. The reemitted pulses decrease in frequency according to the increased summation time and length of the wiring (FIG. 2D) required to reemit pulses from more distal nodes in serial arrays (175,185, 415). What is a conventional loss of temporally coded precision is here an increasingly abstract reemitted 1D z synchrony with proximally precise information (FIG. 3B). To anyone conversant in the art, the design of the convergent nodes in this invention, can vary greatly in complexity. The impingement of approximately equal latencies of input pulses from specific edge detection events (FIGS. 2, 4A), in serial arrays composed of many nodes (FIGS. 2, 2A, 2B, 2C) results in selective reemission of pulses at a frequency that is a function of both latency due to linked distance and the selective topography of inputs that integrate at a node (FIGS. 2, 2A, 2D). The node can be customized for inputs from specific locations (FIG. 4A), or pluralistic input locations (FIG. 4B), at specific times or pluralistic times. Sufficient detail is described here to design many versions of configured or wired circuitry that have the same ultimate result of proximal-distal synchrony of reemitted pulses with orthogonally synchronized sensor array pulses sustained from a stimulus.

The moving z pulse locations sustained from initial stimulation of a 2D array synchronize at a frequency: typically, synchronously emitted z pulses from the first layer of nodes have a total latency to the next reemitting layer of nodes that is approximately equal to the duration of one cycle in the gating frequency (FIG. 4B, 102). This gating frequency may be adjusted to the distance and summation time at a layer of nodes (420) Because the initial 2D surface may have a topography of overlying layers of different sensor types (330), convergence of inputs on subsequent nodes, from simultaneous stimulation of the 2D sensor surface at the imposed gating frequency (FIGS. 2, 4B, 102) and/or slower drift across the sensor surface (FIG. 4A), allows a serial z synchrony to establish by pulse convergence on z axes, from the connected edges constituting an object shape or pattern that sustains pulses from a 2D sensor array. A high shunt impedance between parallel x-y aligned z pulse pathways reduces blur and retains sensor resolution, while a low series impedance in z pathways between repeated topographically aligned arrays, allows pulse rates or frequencies at resonant wavelengths, to rapidly synchronize from temporal and spatial pulse coincidence at serially convergent nodes.

The different sensor types that respond to specific object features take linked routes to nodes that respond to temporally synchronous inputs, in which specific spatially convergent circuits, or coincidence detectors, also respond to the topography of sensors stimulated by a feature pattern within a narrow window of time that is adjustable (420). This process is analogous in the brain, to the serially repeated anatomical convergences at synapses in V1, V2, V3, V4 layers, etc. that terminate at cell clusters in IT cortex (a simplified schema is shown in FIG. 2). The synchronization in time and space at convergent nodes in the last array (150), of the fastest, least-time pulses emitted by the specific pattern of x-y pulses at the sensor surface (100), makes the stimulated location of the proximal array's sustained pulse pattern (100, 102) synchronous with pulses at distal spatially convergent nodes (FIGS. 2, 2C, 2D, 4B). Spatial and temporal resolution of features, and location and size of a specific x-y stimulus, are defined at the sensory surface (100, 330) and the serial arrays that define 3D binocular resolution from monocularly emitted pulses (FIG. 2B). However, emitted stimulation time is a fixed micromemory retained by proximal-distal pulses in continual movement to convergent nodes (FIGS. 3A, 4B) in serial arrays, which spatially and temporally synchronize (FIGS. 4A, 4B) proximally sustained pulses with reemitted fixed pulse times at distal nodes.

At a distal node, including a node in the last array, a reduced frequency of identical z pulses does not decode or reconstruct the complex information in the proximal sensor image to make it identifiable, but is in phase with the complex information impedance-matched by the typically high pulse rate of sustained pulses emitted by the 2D feature pattern (100, 102). Here it is the spatially and temporally convergent z pulse rate or frequency at distal nodes (315, 320) that temporally synchronizes with pulses emitted at the sensor array frequency (102) by specific x-y patterns of inputs; this information is not encoded by phase or latency differences, which are in spikes that are in an averaged frequency typically recorded from physiological electrodes over many trials. Here distal z frequencies result from the feature-selective circuitry that directs identical pulses, via least-time temporal and spatial convergence, to reemit synchronously from a distal node. The specific temporal and spatial inputs that cause reemission of z pulses, converge on nodes in the next array (86, 87, 88), which in turn, have a distributed, selected least-time reemitted response that inputs to the next layer of nodes. The simplified node circuit shown in FIG. 3B (many other versions are possible to those schooled in the art) can be multiplied in cascaded arrays of convergent nodes (FIGS. 2, 2C). The serially reemitted z output pulses do not transmit multiplexed information, but at convergent nodes reemit a single z dimension (with no multidimensional properties) in pulses temporally synchronized with the complex features, orientation, size and location of stimulation at proximal sensors. 1D z pulses here have no defined temporal code required to reconstitute a stimulus, but move sequentially and repeatedly through any distal node that reemits from, and thus selects, specific spatially linked and temporally synchronized pulse inputs (for a brain, this repeated latent reemission is perceived continuity). Moving distal z pulses can also recurrently stimulate, or feedback upon, the feature and temporally selective nodes in the previous 2D layer. The feature selective, spatially patterned links to convergent nodes have convergent RFs, which serially increase in area due to increasing numbers of linked input nodes (86, 87, 88, 340).

The proximal sensors that select various features converge with the same input type at additive nodes in initial 2D arrays (110, 120, 130, 180), but convergence of all sensor and node types may be necessary to selectively respond to multisensory RF patterns at convergent nodes in a last array (150). A specific convergent node, one of many nodes (89) with overlapping RFs in a last array (150, 190, 320), reemits 1D z pulses most rapidly and maximally from input pulses routed by spatial and temporally synchronized reemissions from repeated filtering components or circuits in serial 2D arrays (312, 315). The identical, temporally synchronous pulses do not themselves temporally code shapes or feature patterns. Because these orthogonally distributed filtering circuit modules are identical but specialized for each serial array, subject to the balance of selective parameters designed into the integrated circuitry, specific details, such as location, size and spatial resolution are not reconstituted from temporally coded, tagged or streamed information, but rather, least-time identical z pulses synchronize proximal x-y spatial and temporal information (102, 170, 330) with convergent 1D z pulse moving locations reemitted selectively by nodes in serial arrays including the last array (150, 190, 320). The serially reemitted convergent pulse dimension, z (FIG. 3B), eliminates the multidimensional complexity that is filtered by serially linked nodes in arrays, in favor of reemitted identical 1D z pulses that transiently synchronize linked nodes in serial arrays.

Pattern Recognition by Synchronized Convergence without Learning Algorithms

Conventional machine learning uses a resource and time intensive application of an algorithm that learns responses by the repeated streaming of binary information through layers of digital switches in a neural network and so, in a successive trial-and-error feedback or back-propagation process, eventually 'recognizes' a temporal coded pattern indicated by its probabilistic output convergence to a learned template. The process described here reduces the intensive use of computer resources, by the standardization of nodes in circuit modules, or similar integrated circuitry specific to each serial 2D array, which are preset according to empirically derived circuit summation parameters (420). Superficially this is similar to evolutionary algorithms, which iteratively evolve the fittest solution from temporally coded data, except the process here does not mutate or customize circuitry for each new application. Here a least-time maximal response results from the proximally sustained input pulses that synchronize with the distal few pulses that have reemitted through the summating circuits in nodes of the layers of the neural net shown in FIG. 2. The process here finds the fastest route for spatially and temporally synchronous pulses emitted by as little as one stimulus presentation, which least-time select one of many possible routes through circuits that are set and prototyped, to a few of many similarly responsive nodes with overlapping RFs (FIG. 2C). If different templates are previously presented to the neural network embodied here, the different routes that selectively activate different nodes in the last array define the similarity of subsequently presented 'new' stimuli. Different 2D sizes or locations of the same stimulus category, which temporally synchronize at spatially convergent midlevel nodes, synchronously reemit 1D z pulses that have no multi-dimensional properties, but maximally activate one or a few specific nodes in a large terminal array of nodes (150) that synchronizes with the proximally defined multi-dimensional information (FIGS. 2, 2A, 2B, 2D). Topographically repeated nodes respond to any orientation of features at any x-y location, analogous to simple cells in V1 cortex, which filter pulses emitted by different edge orientations in the specific feature pattern, to reemit 1D z output no matter what the 2D feature orientation, which diverge to multiple nodes in the last array, and also converge synchronous 1D pulse patterns from any stimulus x-y location into a shortest, rapidly reemitted convergent z path to the nodes in the last array, with a proximally-distally synchronous, maximal response. Information is not transmitted to distal nodes by 1D pulses in this invention; spatial inputs temporally synchronize at serial 2D arrays of selective repetitive nodes, so that only temporally synchronous convergent 1D z pulses ultimately reemit. Proximal-distal z pulses synchronize the proximally sustained, specific x-y location and feature information at the same time as a distal 1D z filtered reemitted abstraction serially emits from a spatially connected convergent node (FIG. 3B).

The function of successive temporal and spatial synchronous reemissions at serial nodes is not only rapid synchronization on convergent z-aligned axes, but when a phase-lock occurs at the same transient times at nodes as sustained by the previously emitted z frequency or a sensor array's shift frequency, no sequential transfer of temporally coded information occurs due to the identical z pulses emitted and sustained by the presence of the same edge pattern. Here, the spatial pattern of x-y sensors stimulated by the edges of an image object or a moving edge, moves fixed emitted times of z pulses via links labeled by input sensor type. Initial impedance matching occurs because specific variable stimulus information evokes an equally specific, variable sensor pulse response. But rather than variable feature information coded and multiplexed over time in convergent connections to a terminal decoding site such as a CPU or GPU, here only synchronized emitted times of identical pulses move. The fixed instant that a specific sensor or edge detector is stimulated to emit a moving pulse, is preserved by the synchronous shifting frequency of the 2D sensory surface. This cycling x-y frequency (or clock rate), is synchronized with the z latencies between linked nodes in serial 2D arrays. A just-stimulated population of an edge or shape pattern of pulses, corresponding to a stimulus shape, is synchronized at each cycle of the gating frequency of the initial sensor surface; these fixed emission-time pulses temporally and spatially synchronize with least-time precision at serial z convergent nodes, due to equal speeds, travel latencies and distances of the connections to a selectively filtering, least-time maximally responsive node in a serial array comprised of many nodes (FIGS. 2, 2C and 4). The variable information of a changing or moving stimulus pattern alters the sensor population that responds at any specific time, but is regulated by the orthogonally clocked frequency or rate of pulses emitted at each incremental cycle of synchronized time at the sensor surface. The emitted time of the pulse, is fixed, even when elapsed over time, because the linked distance traveled by the pulse to the next rapidly reemitting, convergent node is proportional to the latency from the emitting x-y synchronized sensor location (FIGS. 2D, 3, 4). The equivalence of x-y orthogonal synchronization frequency with z axis synchronization frequency fixes the initial emitted time and convergent latent time of sequential pulses in the recurring pulse frequency between a pair of linked nodes (FIG. 3B).

An integration of analyzed properties, including a relatively constant pulse speed, is required for intrinsic properties of emitted, latent, sequential and synchronous time to emerge in different contexts from identical pulses (FIG. 3B). Anyone schooled in the electronic arts should be able to implement the impedance matching circuitry that matches the gated timing frequency of edge-emitted pulses with phase-locked frequencies of the same now latent pulses at distally convergent nodes. The sustained, repeated cycling of z pulse emission times at initial sensors, synchronizes proximally-distally, so that nodes linked in regular intervals in serial x-y arrays transiently integrate as a single 2D array at each repeated instant of synchronous pulse z time, or as a dynamic x-y-z 3D structure in a context of sustained sequential pulse times.

Figure 1A:
FIG. 1A) Conventional information transfer sends data to a receiver at any distance; the length of the data stream in a 1D channel is dependent on the total quantity of data and bit rate.
Figure 1B:
FIG. 1B) A data stream sustained from the same edge, cannot synchronize if the duration of the stream of pulses is shorter than the pulse latency between the proximal and distal locations.
Figure 1C:
FIG. 1C) Synchrony of proximal and distal locations exists if any two pulses, emitted by the same stimulus edge with identical information, move past the two locations at the same measured time.
Figure 4A:
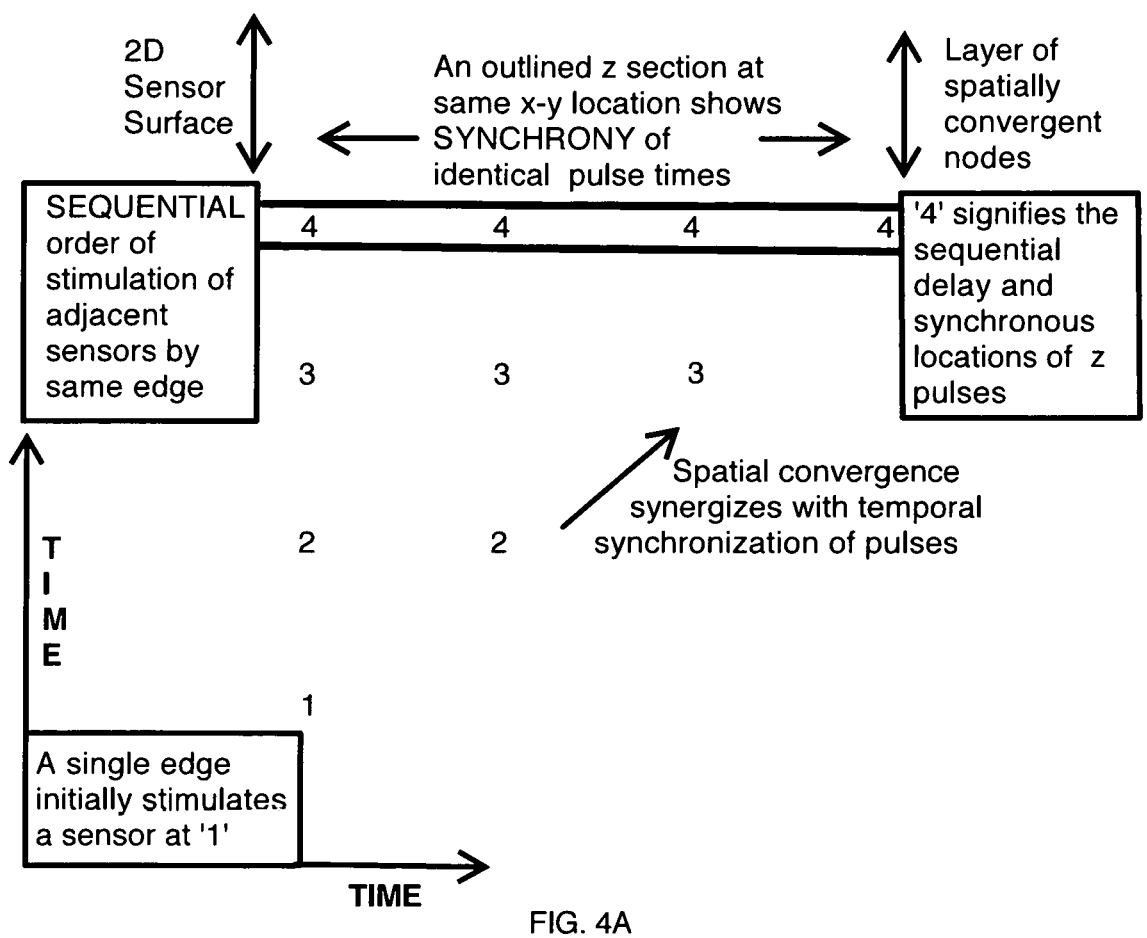
FIG. 4A) 2D time, mapped to orthogonal 2D spatial axes on a 2D page, analyzes generic time into synchronous, sequential, fixed emitted and latent time components. The lack of a location and time code tagged on identical z pulses, enables the dimensional reduction of serial 2D arrays by reemitted 1D z pulses in synchronous proximal-distal frequencies.
Figure 4B:
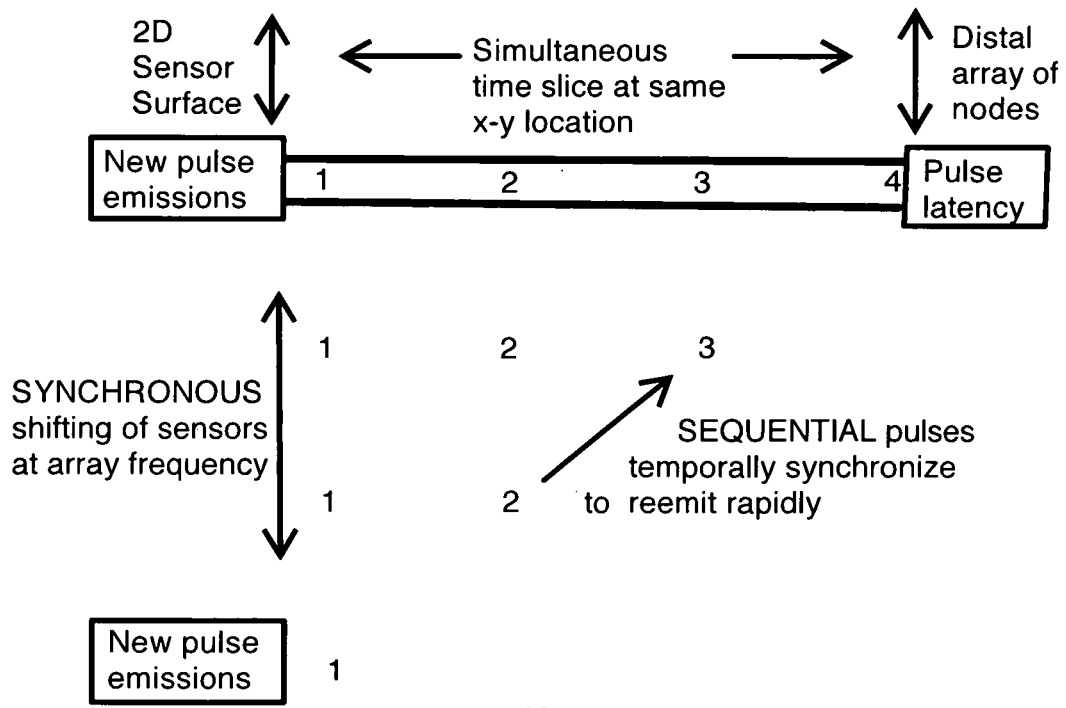
FIG. 4B) Fixed pulse times at a 2D sensor surface emit synchronously at a gating frequency; the emitted pulses retain these times as micro-memories, due to the constant distance/latency ratio resulting from temporally synchronous input pulses at nodes that summate and reemit 1D z pulses rapidly.

This invention uses the identical nature of repeated z pulses that have an initial event or edge-emitted time of sensor emission; because the same pulse increases in latency over z distance through serial x-y arrays, sequentially identical pulses also synchronize convergent proximal-distal nodes in the arrays, when the z pulse repeated wavelength or frequency approximates the distance or latency between linked nodes (FIGS. 1, 2A, 4). This z synchrony requires peripheral sensors to sustain identical z pulses from the same edge or spatial edge pattern for the duration required to activate distal nodes by sequential traversal of serial 2D arrays. The duration of sustained pulses from the same feature pattern edges, matches in convergent 2D time with the latency of any individual pulse emitted by the same edge, to the last array, This sequentially generated proximal-distal synchrony means that information is not transmitted distally, but that filtered, phase-locked distal z pulses have the same synchronized time as that sustained by the proximal edge pattern (FIG. 4A).

Rather than spending many trials to train a neural network with various slightly different versions of a temporally coded stimulus image to create a probability of a correct response to a new stimulus, here the standard nodes in each serial array use a much reduced number of training trials if used in concert with a learning algorithm, since the z pulses in response to similar stimuli take a least-time convergent z route, via serial filters of nodes in 2D arrays, which have the same 1D synchronous relationship via intermediary nodes (300, 305, 310, 312), to the maximally responsive nodes in the last array, with x-y similar stimuli from various sensory array locations, stimulus orientations or cross-sectional areas (FIG. 2D). The continuously sustained proximal pulses emitted from the sensory array create a dynamic persistence of long latency z pulses on z axes; these sequential 1D z pulses create a z-axis continuity, over time and distally linked convergent nodes (400, 410, 415), which differentiates this invention from conventional phosphor persistence on a 2D screen that results from temporally coded raster scans of an image that blurs, or has a jittery strobed effect, from the x-y movement of objects or of the camera's sensor array (FIGS. 4A, 6), in the conventionally reconstituted image. This model of least-time convergent z synchronization at specific identifying nodes of many terminal nodes, in the aspect of the invention described here, is an advantageous alternative that uses less time and computational resources, than the repeated feedback of learning algorithms that probabilistically match temporally coded images with a coded template in memory. In this invention one hardware/software design of circuit modules, with one or a few stimuli, determines with one or a few iterations, one or several least-time paths of 1D pulses to identifying nodes in a last array.

Convergent Least-Time Synchrony and 3D Stereo Vision

In another aspect of the invention, z synchronization is especially advantageous for 3D stereo vision, which requires precise timing of signals from dual x-y aligned monocular images in current technology, to create spatial-temporal differences in depth of the stereo image presented via screens or goggles to an individual's eyes. In the embodiment here, synchronous monocular z pulses emitted by the same x-y mapped edge(s) impinge at least-time convergent binocularly activated nodes, in serial arrays similar to the retinotopically aligned layers of V1, V2 and V4 cortical 2D surfaces (FIG. 2B). Serially linked binocular nodes (250) respond to the matched monocular disparities in the position of the same edge in the 3D connected edges of the dual 2D images. They also respond to the relative parallax, or distance to a moving object that becomes higher resolution, as the magnification of the object increases closer to the object. Here, binocular nodes (250) reemit rapidly only from monocularly matched links (210) that convey synchronized monocular pulses, with equal travel times from the same aligned x-y edge-locations. The convergence of synchronously activated monocular pulses from the same edge (200), in serial binocularly activated nodes that respond to the stereoscopic distance and the parallax at that distance as monocular sensor arrays get closer to the same edge of the object, reemits high pulse rates that correlate with the higher 3D resolution at close distance to the target. The synchronously summated, reemitted pulse times have a high binocular precision that increases with the increase in separation, or disparity, between the dual monocular sensor representations of the same edge. The selection of synchronous inputs from the same edge, by sequential 2D layers of retinotopically aligned binocular nodes, coupled with proportional pulse asynchrony that results from the degree of disparity and parallax of adjacent nodes with less precisely aligned monocular inputs, reemits to create a proximal-distal ordering of perspective in 3D space. Because binocularly integrated, reemitted pulses are in temporal synchrony with the sustained, dually aligned monocularly emitted pulses, a monocular tag identifying x-y location and emitted time is not necessary and not communicated by identical z pulses that spatially and temporally synchronize at any least-time binocularly responding node in an array containing a plurality of potentially responsive nodes. This continuously reemitted procession of sequential pulses at high frequency that repeatedly synchronize all stages of serial retinotopic nodes, which creates 3D stereo precision, improves on current procedures that use computationally expensive resources to calculate and extract, from the overlapping temporally coded spatial reference coordinates of dual monocular images, 3D distance and location. The 1D z pulse serially reemitted synchronization here, is not a multiplexed version of peripheral monocular information, but endures as an increasingly latent, precise, distally reemitted continuous response to the x-y synchronized, sustained emission times of monocular feature patterns. By avoiding repetitive algorithmic computations of absolute 3D reference coordinates at each increment in time, cumulative imprecision and temporal lagging between sequential monocular images are avoided in the embodiment here, when reemitted from temporally and spatially synchronous high pulse rates, onto stereo screens, in virtual reality goggles or robotic graspers. The implementation of convergent circuitry described here reemits more rapidly and precisely from temporally and spatially synchronous impedance-matched dually mapped inputs to 2D arrays of imaging nodes to create a less fatiguing stimulation of the goggle-wearer's eyes. Adjacently mapped nodes in such an array of pluralistic nodes, do not rapidly reemit in the invention described here due to a relative asynchrony from the same edge-stimulated sensors, but do reemit rapidly to a screen (or screens) of stereoscopic imaging nodes from adjacently mapped sensors, due to equal latencies from edge-matched monocular images.

Convergent Least-Time Spatial and Temporal Synchrony Mediates Space Constancy

In another aspect of the invention, a direct result of the temporal and spatial precision of synchronous input pulses at distal convergent nodes, is that the x-y jitter that necessarily results from edge-generated pulses resulting from the orthogonal clocking frequency of the peripheral 2D sensor surface (or periodic shifting of a screen fronting the surface), is used to synchronize the temporal timing of z pulses with the repeated x-y location of the sensor vis-a-vis a stimulus edge or edge pattern. Stimulus edge-crossings at a gated or clocked frequency emit z pulses that move at a speed synchronized with distance to serial arrays of spatially convergent but also retinotopically mapped nodes (FIGS. 2A, 2B, 2C), to match the timed intervals of gated pulses with summating latencies at pluralistic nodes in a distal array (250), which reemits z pulses from x-y synchronous inputs at each phase-locked instant, preserving proximal temporal and spatial resolution distally. Coincidentally, the spatially convergent temporally synchronous dual monocular pulses reemit a single binocular pulse without the x-y input jitter, due to the single z output pulse remitted from each x-y aligned pair of synchronized pulse times (FIG. 2B, 3B). This synchronizing process from paired identical input pulses, spatially stabilizes each cycle of orthogonal x-y jitter without averaging over accumulated cycles of high frequency jitter. Current paradigms that 'pool' via repetitious application of algorithms, temporally coded, temporally unstable images, so that a stable image is averaged over time, or coincides with a stable template in memory, reduce the spatial and temporal resolution of the reconstructed image due to fine and/or continuous changes over time. In the embodiment here, because the x-y label of identical monocularly emitted z pulses is not present at a spatially convergent serial node (FIG. 3B), and a serially mapped node's reemissions have a period that synchronizes or phase-locks with pulses emitted at the sensor gating frequency, the repetitively synchronized instant of the z dimension reduces binocularly aligned 2D surfaces to a proximally-distal stable 3D stereo structure, of high distal spatial and temporal resolution, at each reemitted phase-lock of the proximal gated pulse frequency (FIG. 2B). The same reemitted 1D z pulses mediate both binocular stereo synchronization and spatial stability; here, the impedance matched response of convergent identical z pulses that respond to any peripheral stimulus type does not require the conventional multiplexing of temporally coded information transmitted to a stable distally reconstituted image at spatial convergent terminal nodes in a last array. A regular frequency of reemitted z pulses, without changing x-y information and thus x-y stable, spatially converge at repeated nodes in distal arrays; image stability is a property of repetitive identical z pulses and not of nodes in topographical arrays that respond to least-time shifting inputs. Because distal convergent z pulses also have a proportionally increased latency with no x-y jitter at the distal wavelength and frequency of proximal-distal synchronous pulses, emissions of the identical pulses can be skipped cyclically, while still retaining x-y-z stereo synchrony and phase locking at multiples of the proximal wavelength between pulses.

The identical z pulses are moving locations and fixed emitted times in one dimension, not shifting x-y information that is decoded in the process of stabilizing the 2D image. The requirement for high frequency input pulses that converge at spatially convergent nodes within a short time window to cause z reemitted pulses, eliminates noisy uncorrelated inputs at early stages of spatial circuit and temporal pulse convergence. Convergence of identical z pulses from several sensor types at a distal convergent node, does not average or multiplex presumed temporally encoded information emitted at the peripheral sensor or pixel surface, but each stimulus edge at each proximal sensor at the gating frequency, emits pulses that synchronize at a convergent node (FIGS. 2, 2C, 2D). The lack of detailed 2D information in 1D z pulses, means that multidimensional proximal inputs do not affect the 1D property of synchronously reemitted z pulses. In other words, because the z dimension is 1D synchronous and uses serial x-y spatial convergence to serially reduce reemitted z pulse rate at low stimulus intensities, convergent terminal 1D z pulses are not affected by variable multidimensional properties such as orientation, size or location of inputs. Z pulse reemissions from proximal x-y synchronous sensor emissions, synchronize latently at distal arrays of node(s), which also stabilizes any peripheral jitter in x-y sensor responses, via synchronous convergence to one dimension of z pulses (FIGS. 2, 3 and 6).

Convergent Synchronization of Proximal Precision with Imprecise Distal Abstraction Another embodiment of the sequential transfer of z location by identical pulses, shows that it is not necessary to repeat the precise sensor or pixel timing in subsequent serially convergent, synchronously activated z axis aligned nodes. While repeated x-y registry at serial 2D surfaces retains x-y resolution and precision (for spatially convergent binocular stereo vision, for example), the fact that image information stays at the initial sensor interface, means that a range in temporal delay or quantity of pulses at a convergent node from sustained inputs may lose temporal resolution, though not sequential order, if the convergent terminal node does not rapidly reemit. Similarly, repeated convergence of pulses that reduce rate at serial nodes loses precision at a distal spatially and temporally convergent node. This loss of precision with serial summations or recursion is, in microwave theory, a loss of quality (Q) factor, which defines quantitatively the loss in resolution. Here, synchronous timing of z pulses at the proximal sensor surface retains this timing at a distal convergent node if quickly reemitted at intervening serial nodes, or phase-locked with sustained proximal pulses. However, if pulse speeds are synchronized with proportional travel distances and latencies, this causes increased spatial and temporal convergence to lengthen the summation period at each serially active node, so that lower rates of pulses reemit at more distal convergent nodes. In physiological spike recording of fixational eye movements and in some machine learning paradigms, increasing the time-bin duration for averaging spikes increases the positional and temporal stability of a neuron's RF, along with an increase in RF area. The longer summation period and longer latency of pulses at a convergent terminal node synchronizes with the rapid rate of emitted pulses sustained at proximal sensors or pixels; the slower convergent reemitted pulse rate synchronizes at reduced frequency, but at every second, fourth, etc. cycle of the high sustained proximal pulse rate. This latent temporal stability of sustained emissions, due to the fixed emission time that has endured over time and over a linked distance, is synchronous or phase-locked with repeated stimulation by a peripheral edge. Because this sensor-emitted, fixed pulse time is repeatedly present in the convergent receptive field of a terminal node, the synchronous effect is that sequential z time has fused with increased pulse latency, even though each increment of sustained pulse fixed emitted time has high sensor spatial and temporal resolution.

Proximal-Distal Convergent Synchronization Embodied as a Reading Mechanism

In another embodiment of the synchronized movement of z pulses with no temporally coded information to convergent nodes, a rapid reading mechanism results. Such a mechanism requires the stepped transfer of identical z pulses stimulated by each orthogonally synchronized x-y pattern of edges that make up letters, words and sentences. The multiplexed transfer of all the information in the edges that make up letters as they are read, taxes the current ability of a central cognitive analyzer. However if the pattern of pulses in response to the letters in a word, temporally synchronizes at a convergent node that reemits a single pulse to a specific word letter pattern, then successive reemissions, from repeated convergence of z pulses emitted by spatial and temporal synchronizations of stimulatory letters, words and sentences, acquires a serial increase in abstracted meaning (FIGS. 2C, 3B). This graduated increase in context from convergent word summation is able to filter out discrepancies due to words that are interpretable in multiple ways. Rather than transmitting an increase in pulse rate corresponding to increased contextual information, the temporally synchronous z pulses emitted from spatially defined inputs, first as letters, then words, and then sentences, increase spatial convergence and temporally integrate as reemitted slower pulse rates at each serial node. Because the terminal convergent contextual interpretation of a sentence, reemitted from serial spatially convergent nodes by temporally synchronous pulses, synchronizes with z emitted times sustained by the peripheral pattern of letters, the information in the letters does not need to be coded and transmitted centrally as a temporal multiplexed code. The specific convergent route of z pulses to specific distal nodes is a function of the specific edge pattern that is x-y synchronous at sensors (330, FIG. 4B) and serially filters as a matched proximal-distal z synchronization (FIGS. 2A, 2D). These proximal-distal relationships are specific to the x-y edges or letters, which result in cascades of non-informational identical z pulses, which spatially converge via integrated nodes as shown for a simple circuit in FIG. 3B. The route to any of multiple nodes in the last array varies according to least-time reemissions of temporally synchronous pulses that impinge on the next equidistant convergent node in serially repeated arrays. This preprogrammed route can latently change according to the changed meaning of stimulus words or acquisition of new words, which can be programmed as changes in software that affect reemission parameters (420), or learned from newly asynchronous proximal-distal relationships that correct via synchronization at nearby nodes in the same array. Specific proximal sensor information synchronizes with the distal node's convergent synthesis of meaning context from that proximal information; dissonant z asynchronies result if contextual meaning is not consistent with proximal x-y data. The refinement of contextual meaning occurs with a window of exposure to stimulatory data at a sensor array that is long enough to establish successive temporal synchronies at spatially convergent serial nodes culminating at a least-time distal nodes without requiring successive feedback of temporally coded information or the use of a repetitively applied algorithm that learns over time to become more probabilistically accurate in recognizing a word sequence or other data by comparison with a specific template. The quickest route to any of many nodes in a last array, which repeats to exposure to the same or similar words, governs the convergent dimensional reduction of many proximal sensors in an x-y array, serially through arrays of similar nodes, to a few nodes in a last array. As shown in FIG. 3B, the 1D z pulse reemits from two or more synchronous input pulses, which are identical without location or time tags or an informational code. The 1D pulses have no 2D (such as letter location or font size) properties, due to repeated 2D arrays of spatial links that converge pulses; as moving z locations and times, serially reemitted pulses spatially and temporally synchronize in least time with the actual variable sensor x-y information. This process does not diminish in speed or efficiency with increased amounts of stimulatory information, since here, only 1D temporal synchronies transmit through 2D arrays to distal nodes, and so reduce frequency with the distance or wavelength between pulses transiently at linked nodes (FIGS. 2A, 2B, 2D).

Proximal Sensory Data Can Synchronously Converge to a Distal Synthesis

Other embodiments of spatial sensor convergence that temporally synchronize sensor-emitted pulses at serial nodes, are useful for integration of the outputs of for example, monochromatic color sensors, which respond differentially to the intensity of RGB or CMYK specific colors, at each specific image pixel, to give an integrated response specific for a single hue, among thousands possible. Physiologically, this distal retinotopic map does not reconstruct the proximal image, rather this distal map reiterates and integrates the x-y maps at the monocular retinas, not from a temporal or multiplexed code, but is an embryonically preset structure that is hardwired in circuit modules in this embodiment. Here, the identical z pulses converge to each x-y location in a distally reiterated map from the RGB, CMYK or other arrayed sensors, and so create an integrated map of convergent hues synchronized proximally distally with each sensor x-y location (FIG. 2B). In physiological visual systems, 3D resolution requires high distal spike rates and reiterated spatial topography to synchronize x-y aligned proximal and distal 2D maps. The circuitry of each successive convergent node selectively responds to the spatial and temporal synchronies resulting from any perceptual feature, such as the tactually-sensed shape of a stimulus, or the visual characteristics of a specific face, or hue of an object, or its smell, according to the type of peripheral sensor or the topographical pattern of sensors stimulated, coupled with the specificity of convergent serial circuits that only reemit z pulses from the most rapidly summated temporal and spatial synchronies of input pulses. Spatially convergent nodes the most distal from the proximal sensor array have no specificity for sensor or pixel x-y location but have synchronous proximal-distal timing with emitted times, or edge micromemories, that converge the most rapidly summated pulses at a distally reiterated map (FIG. 2B). Here an array of terminal nodes (150, 250, 320) are individually least-time maximally responsive to convergent synthesis of hues, z synchronized by least-time temporal and spatial convergence of identical z pulses, with sustained pulses emitted from specific sensor types and locations, analogous to trichomatic cones in human vision.

Figure 7A:
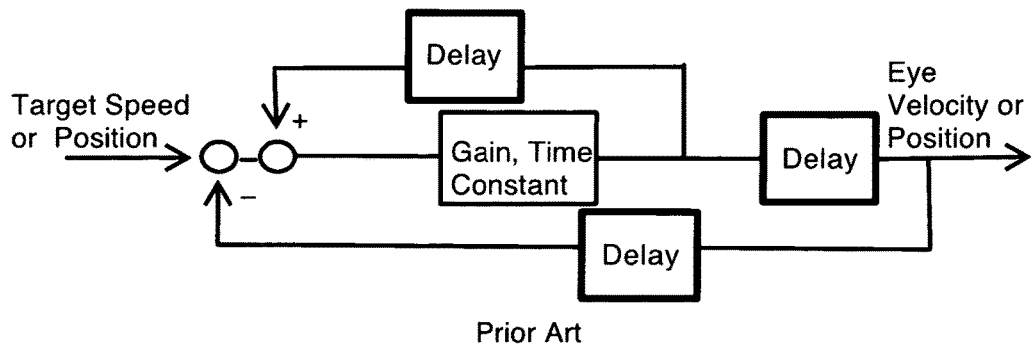
FIG. 7A) Conventional feedback of temporally coded information requires delays for algorithms to compute spatial errors. These delays reduce precision near the moving target, when more is needed.

Embodiment of Convergent Synchrony as an Accurate Robotic Grasping Mechanism In an embodiment of this invention, reaching inaccuracies of a robotic hand as it closes on an object, which are due to the increased relative motion that stimulates imaging sensors as the object nears (FIG. 7B), can be reduced by not reconstructing the sensor image at a central processor, which in current technology requires much data flow and processing of serial images that delay and blur the computed position of the looming object (FIG. 7A). This process is improved here by the temporal synchronization of z pulses between convergent nodes stimulated from sensory 2D surfaces, so that the variable or motile edge information in the image stays at the peripheral x-y sensory interface, while repeated z pulses dynamically synchronize the most rapidly activated (or least-time) destination nodes with edge features transiently selected by specific, small RF sensors of different types (330). Reemitted z pulses at serial convergent nodes, with a timing periodicity synchronized to the orthogonal sensor emission timing of motion-stimulated target-edge events, do not require encoded images to be reconstructed distally. With increased rates of motion-stimulated edge pulses from sensors nearing the target object (FIG. 7B), more rapid spatial and temporal summations synchronize at higher pulse frequencies at distal convergent coincidence detector nodes, especially as the image object drifts across and is not centered on the sensor array. As shown in FIG. 6, aligned locations of a target edge and the nearest sensor in an array, synchronize rapidly as a stimulus edge drifts across sensors; edge motion and convergence of pulses to a node synergize, to increase the frequency and reduce the latency of the edge emitted pulses at a serially convergent node. The convergent pulses that synchronize at maximal response rate and reduced latency from the same target edge, increase precision of a sensor in the array with respect to the target being grasped. Emitted pulse times in unaligned nodes (with respect to the serially aligned node pair currently under observation nearest the target edge), may be interpreted by an observer as 'error' responses. But if the pair of serial nodes is adjusted so that pulse least times and shortest travel distances are selected for observation, this target edge alignment error is much reduced (shown by higher pulse frequencies in FIG. 7B). This increased precision does not require coding and transfer of negative feedback information to a central processing unit (FIG. 7A), but coinciding 2D sensor and motor control maps rapidly stimulate corrective off-center pulse reactions, which increase convergent summation of identical 'error' and correctly aligned pulses to the last node (FIG. 6) that responds in the least time, therefore most precisely, to the moving aligned target edge.

Figure 5:
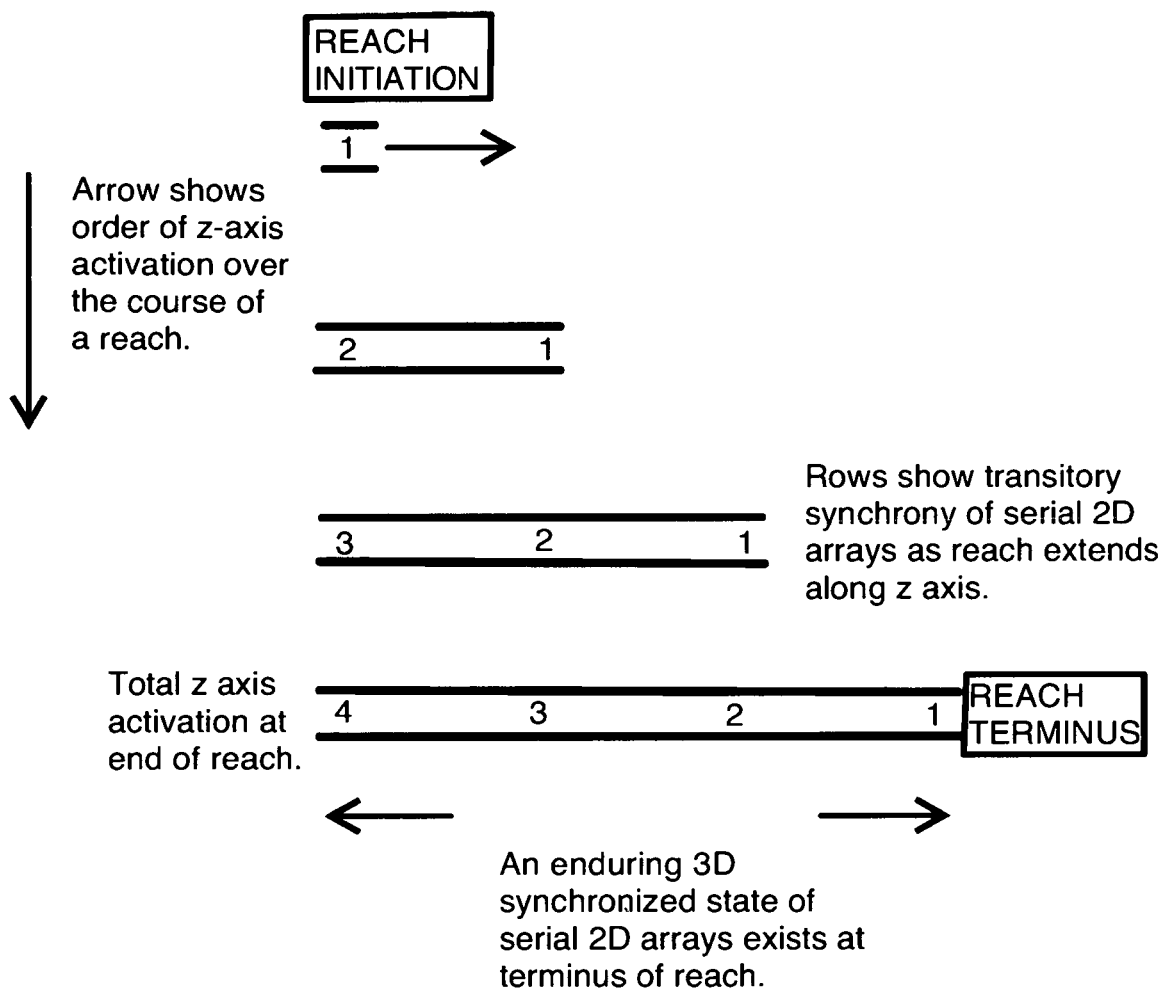
FIG. 5) During a reach, sequential z pulses synchronize at progressive locations along the z axis.
Figure 7B:
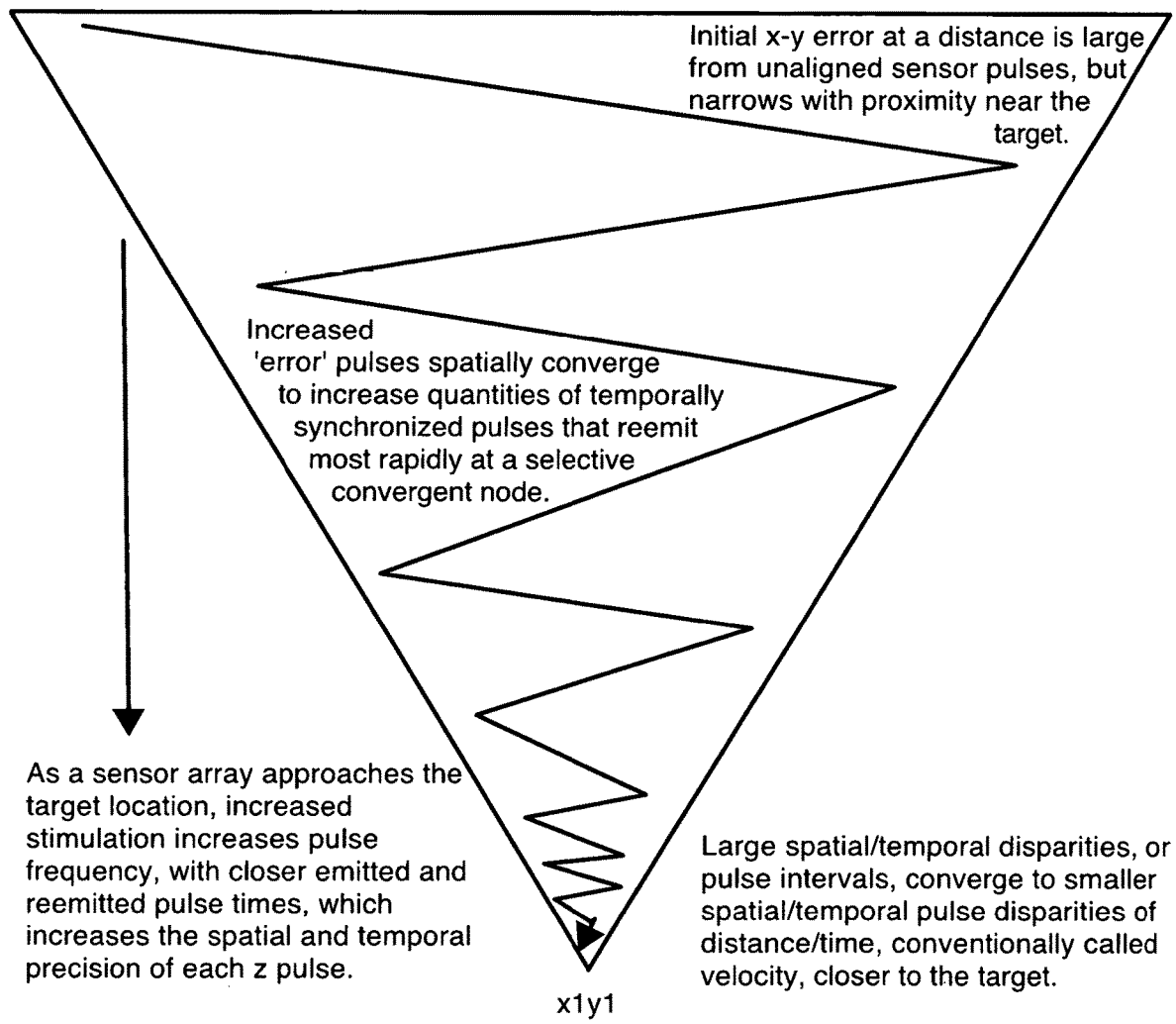
FIG. 7B) Pulse rate from a 2D sensor array increases as it nears the target, thereby increasing the precision and decreasing least-time convergence of pulses to an identifying node in the last array.

In a similar aspect of the above embodiment that uses identical pulse repetitions that synchronize without transmitting temporally coded information, the stimulation times of sensor emitted pulses are fixed as micro-memories (FIGS. 3A, 4B). Peripherally emitted micro-memories at specifically mapped event or edge detectors, are retained as fixed emission times due to reemitted pulses that synchronize, or phase-lock, with sustained proximally mapped pulse frequencies. Again, if these fixed emission times sustain after a short stimulation time or due to the sustained presence of the stimulus object on sensors repeatedly stimulated at the peripheral gating frequency, distal z axis synchrony results. Circuitry embodied here that is roughly analogous to that in the brain's cerebellum, uses the topographical input lines, each with temporally synchronized, identical z pulses, to increase convergent precision at a least-time reemitting node, despite the temporal delays of pulses sustained from changing target positioning as a visual and/or tactile 2D sensor array nears the target (FIGS. 5, 6, 7). Traditionally this is explained by negative feedback that uses the repeated application of the same algorithm to increase accuracy from increasingly precise reference coordinates if the target is stationary or in a predictable trajectory (FIG. 7A). But due to feedback delays, if the target moves unpredictably, precision is lost. It is also established in physiological systems that reference copy, a form of predictive feedback, has two orders of magnitude less precision, at several arc-degrees, than the resolution of a retinal receptor with a precision of a single arc-minute, so cannot stabilize the jittery image of a target caused by fixational eye movements. Here, these feedbacks are replaced by the orthogonal x-y precision at repeated 2D surfaces of traversing least-time z pulses, stimulated by a moving or stationary target. In the embodiment described here, the external image information stays at the sensor surface, however sustained orthogonal shifting at the sensor surface across x-y stimulus edges, clocks or gates the repetition of precise, fixed-time micro-memory z pulses, which temporally synchronize the sustained emission of pulses that spatially converge most rapidly along linked z axes. Because fixed emission, edge-generated times are preserved by the synchronized, rapid reemission of z pulses in x-y topographical maps of the repeated microzone surfaces in the cerebellum, the greater spatial resolution of sensors in close proximity as a sensor array nears a target, serves to increase the temporal and spatial precision of pulses stimulated by an unpredictably moving target. This just-in-time increase in precision as a target nears is not in temporally coded information, but is due to fixed micro-memories of increased z pulse rates, causing more rapid temporal and spatial z pulse synchrony of sensory-motor aligned topographical 2D surfaces (FIG. 7B). This proximal precision is not governed by a predictive efferent copy of low accuracy, but requires the continuously shifting transient alignment of temporally synchronous z pulses as they move through repeated topographically mapped 2D surfaces (FIGS. 5, 6), as hypothetically occurs in the cerebellum. This proximal-distal z synchrony enables a rapid detection and reaction to small x-y deviations by a visual or tactile sensory array, especially as it looms in higher resolution near a target (FIG. 7B).

In a conventional circuit, negative and positive feedback of coded target information loops back to a processing unit to control sensor location with respect to target location (FIG. 7A). If one uses neural circuits in the cerebellum as a model for the embodiment described here, the few distal long latency pulses align with new pulses at proximal 2D maps (FIGS. 5, 6, 7B), which increase pulse rates as edge misalignments across sensors occur. The convergent schema of FIG. 7B shows how an inaccurate broad stimulation of sensors as they move near the target, converge pulses nearer the target from a narrower, more intensely stimulated sensor area to synchronize proximally-distally, without an actual error being measured at a central processor. In the embodiment for robot grasping here, it is the increased convergence of z pulses that more rapidly summate, at an increasing rate or frequency, at a node in a distal array most closely x-y aligned (or least-time precise) with the target, which causes accurate grasping of the nearing target. As implemented here, continual sensor realignment according to the target position in space is more rapid than current methods, due to z synchronization that occurs more rapidly at high sensor pulse rates evoked by target misalignment and target nearness. Current information coding of target location via looping circuits to a central processor introduces unavoidable delays, which cause increased feedback gain error and oscillations (FIG. 7A).

An Embodiment of Convergent Pulse Synchrony for Brain Machine Interfaces

The continuous motor realignment of the sensors composing a surface as it nears a target, in response to targeting error that occurs in near real-time, is important for the design of BMIs. Currently BMIs require the repetitious application of algorithms to decode cognitive cortical spike patterns into a form that commands peripheral muscles into a particular reach or configuration. However there is much variance, from day to day and trial to trial, in these cortical spike patterns, even though inputs are the same, which result in motor mistakes. The heterogeneous inputs, recorded at synchronous times by an electrode array on the cortex, are due to the unknown origins and emitted times of the recorded spike populations, along with neural adaptation and varied tuning over time of specific recorded neurons to properties of the motor movement, such as its varied direction, distance and speed to the same reach endpoint. Because spike patterns are conventionally interpreted to be a code requiring decoding of distance, speed and directional information as a reach occurs, experimental variance exists. Here this variance is resolved by the interpretation that successive spatial and time synchronies of z spikes at convergent nodes in sensory-motor 2D surfaces reemit as a 1D z dimension, as shown in FIG. 6 (based on the simple convergent mechanism of FIG. 3B), which is synchronous with, but does not encode 3D movement information that is emitted from heterogeneous nodes of varying distances and locations from the recording electrodes. In the embodiment described here, because only the reach endpoint is preset in advance (FIG. 5), sensory-motor x-y alignments readjust in near real-time, proximal-distal synchronization of the one z dimension. This 1D z pulse rate emitted by any node, as defined here, is synchronous at serial, distally increasing locations along convergent routes during the reach (FIG. 5), however aggregation of heterogeneous spike signals to make the signal less noisy in current methodology, loses this serial temporal specificity that is present in single trials. The coding-decoding process of current BMIs also creates a feedback lag that is inherently variant with respect to the time of the sensory inputs (FIG. 7A). In fact, recorded spike times, measured as duration and amplitude in experiments, are the dominant physiologically invariant property (here, this invariance is the constant ratio of proportional location/time of pulses in the z dimension). At the start of a reach in motor cortical populations of neurons, information about reach characteristics such as distance, speed or direction are not initially measurable in the trial. Statistical analysis of the complete data results in a single dimension of time that is shown graphically to be invariant, despite the multiple dimensions of the reach (its distance, speed and direction) which do vary, and is most predictive of subsequent shortening of reaction times in trial-to-trial reach experiments. A realization of the embodiment here as shown in FIG. 6 requires a more precise knowledge of the origins, emitted times and latencies of specific spikes, routes and convergent connections between and within 2D surface maps, which can be obtained with multiple electrode arrays. This precise mapping can adjust to synchronized alignments as they shift among neurons during the course of the reach to a target. The focused z synchronization to a single x-y alignment as resolution increases near the target (FIG. 7B), is proposed here to increase accuracy, without the repeated application of algorithms that delay the resultant target's computed location with respect to the input timing. This inherent lag of looping feedback circuits (FIG. 7A), along with the heterogeneous factors stated above, limits accuracy and precision of current algorithmic methods used in BMI experiments, which have a reported variance of 50-70%. Because z location/time here is 1D and is the dominant property at high resolution at convergent x-y locations of linked serial nodes (as shown in FIG. 3B), the z synchrony of high pulse frequencies in the embodiment here, with proximal sensor emitted times and rapidly reemitted distal pulse times, reduces probabilistic variability of synchronous pulses as lag diminishes near the target at higher stimulated pulse frequencies (FIG. 7B).

To recapitulate, the sensor-generated fixed emission times of pulses stimulated by edges or the filled area of a stimulus object, constitute a population of collective micro-memories with temporal and spatial precision, which spatially and temporally synchronize at frequencies inversely proportional to the distance and latency between linked nodes (FIGS. 2A, 2B, 2D). The population of proximal sensors activated by stimulus edges, responds synchronously to the gated frequency of the shifter array (FIG. 4B) or to larger movements of a stimulus across the array (FIG. 6). due to the high spatial resolution of the sensor array and temporal resolution of the emitted pulses. The serial outputs of convergent nodes in aligned, repeated 2D surfaces would thus convey a sequence of spatially varying population responses, at any clock- or gated increment of synchronized pulses, which, due to rapidly reemitted temporal and spatial convergence within the sustained proximal-distal synchrony best visualized and enabled by 2D time, limited by the dimensions of a 2D page (FIGS. 4A and 4B; 3D time of 3D physiological volumes are not shown). Sensor-emitted pulses temporally synchronize proximally detailed or moving stimulus information, with identical distal z pulses. It is the successive movement and reemission of temporally synchronous, spatially convergent z pulses that endures from sustained edge stimulation (FIG. 3B). While this invention does not store edge imagery or information over prolonged time, it can be used with such data stored in various memory devices such as RAM, ROM, EEPROM, the cloud or various other integrated circuits.

In the embodiments, aspects and variants of the invention described here there is no transfer of conventional temporally coded information by 1D z pulses. Parallel 1D z pulses emitted cyclically at an array frequency (FIG. 4B) (in conventional physics, interpreted as planar or surface waves), comprise a synchronous frequency that does not transmit coded information that reconstructs a sensory image, but which phase-lock serial arrays of nodes up to and including a last array. The properties of sequential, synchronous, emitted and latent time are intrinsic qualities transiently present in otherwise identical moving z pulses as they move through connected paths of convergent nodes in serially aligned arrays (FIGS. 3B and 4A, 4B). In contrast to a typical temporal code of static bits of information, the temporal z dimension alters context according to the plurality of spatially and temporally neighboring pulses; a z pulse that does not quickly reemit at a convergent node becomes a completely new emission time, or micro-memory (FIG. 3B). Z pulses that are synchronously present at linked nodes at the same approximate time as they move at a rapid speed, have an intermittent sequential context in intervals between mapped arrays of nodes (FIG. 4B). Synchronization that is more rapid than the latency between pulses (e.g. 'anticipatory synchronization' found experimentally) requires multiple pulses, a moving z dimension at a frequency and speed that transiently positions identical, sequential pulses at repeated 2D surfaces at the same objective times. It is required that conventional information is encoded in a form, such as multiplexing, so that informational conflicts of sequential sensory images are not present at one location but are allocated to different locations when decoded. In contrast, the embodiments here all use emitted and reemitted times of moving sequential identical z pulses to temporally synchronize sustained proximal multidimensional information with distal, serially latent, continuous 1D z time.

What is claimed is:

1. A system comprised of at least one of a pulses selectively propagated through a set of serial 2 dimensional (2D) arrays implemented as an electrical network, the system comprising at least one of a sensors in a first array that emit the pulses due to at least one of visual and haptic stimulation, via links connecting to at least one of a nodes in the serial arrays, the pulses serially propagating by a temporal synchrony of at least one of the input pulses to at least one the nodes in the serial nodes, with a summation number of the pulses and a temporal summation duration configured as a parameter, adjustable to emit at least one output pulses, which pulses in turn, converge as inputs to at least one nodes in downstream arrays, thereby serially propagating pulses to at least one nodes in the last serial array;

wherein, stimulation comprising at least one of a) a 2D feature pattern and b) a sequential moving event, empirically determined as a target from previous application of the variably similar stimuli, sustains the emission of pulses from sensors that selectively propagate in serially linked nodes, which sustained pulses thereby operationally connect, at least one the stimulated sensors of the first array and at least one said nodes in the last array;

wherein input pulses, which emit output pulses from at least one nodes configured by the adjustable parameter of the at least one nodes, emit an output pulse latency required for pulses to travel a linkage distance between at least one the nodes and at least one the downstream serial nodes, which pulse latencies summate to the maximal temporal duration of at least one nodes, which duration is adjustable as the parameter necessary to emit at least one the output pulses at a pulse frequency from at least one the nodes from temporally synchronous input pulses;

wherein the pulses emitted by stimulated sensors, by the selective propagation of said pulses reemitted through the serial nodes to at least one the nodes in the last array, operationally connect the target stimulated sensors in the first array with at least one nodes in the last array, in which at least one of a maximally stimulated 2D sensor locations are measured from a concurrent position of a prosthetic or robotic implement, whereby a minimized measurement, makes coincident the concurrent 2D sensor locations of the target stimulated pulses and the position of the prosthetic or robotic implement.

2. The system as in claim 1, in which the temporally synchronized pulse frequencies emitted between at least one and at least one other downstream serial nodes, have associated pulse latencies between the at least one and the downstream one other serial nodes, in which the summated durations are adjustable with the parameter to cause reemission of pulses at the one other given serial nodes, in which concurrently emitted sensor 2D array pulses operationally connect to serial downstream nodes, including at least one node in the last serial array.

3. The system of claim 2, comprising a sensor array frequency is caused by a frame rate or an oscillation frequency configured with a periodic amplitude substantially matching a minimal diameter of the sensors in the array, whereby synchronization of said array frequency with the pulse frequencies or a harmonics thereof, is adjusted so that at least one pulse reemits from the at least one serial downstream nodes to at least one nodes comprising the last serial array.

4. The system of claim 3, wherein the array frequency pulses emitted by the stimulus target and synchronized with the at least one pulse frequency or a harmonics thereof, selectively propagate as serial 1D locations with serial sensor emitted times, which operationally connect concurrently stimulated sensors at 2D array locations with convergent 1D pulses emitted by at least one node in the last serial array.

5. The system of claim 4, wherein sustained pulses, selectively propagated due to the temporal synchrony of array frequency pulses of substantially equal convergent latencies from the stimulated sensors, serially reemit from serial nodes at a maximal the pulse frequencies adjusted by the parameters to rapidly reemit serially convergent output 1D pulses from downstream nodes in the serial arrays to at least one node in the last array.

6. The system of claim 5, further comprising the parameters that synchronize the emitted pulse frequencies between at least two the serial nodes, are adjustable with at least one of a configured controls, thereby optimizing the convergent reemission of synchronous pulses, for increased precision and accuracy of output pulses and so a temporal resolution of emitted pulse times, in which said output temporal resolution increases with said maximal pulse frequencies of the convergent output 1D pulses to at least one the downstream serial nodes.

7. The system of claim 6, comprising that stimulation by the target, of synchronous pulses at the array frequency with serial emission times from a pair of monocular sensor arrays, move via the shortest latency links to at least one binocular nodes in at least one serial arrays that summate convergent temporally synchronous pulses, which thereby rapidly reemit 1D output pulses with at said maximal frequencies from at least one the binocular nodes;

wherein, the operational connection of pulses emitted from a pair of monocular the 2D arrays at the array frequency stimulated by the target, determines, from the synchronously timed input pulses that are necessary to rapidly remit 1D output pulses from binocular nodes adjusted for precision and accuracy by the parameters, a 3D location of the stimulus target as aligned with the monocular 2D sensor arrays, for use by said prosthetic or robotic implement or a stereoscopic device.

8. The system of claim 7, wherein the linked nodes in serial arrays, limited at least one of: 1) the temporal synchronization of the input pulses with the output pulses at pulse frequencies adjusted with the summated duration parameter between at least two the serial nodes; 2) said stimulated sensors in the first array that emit pulses with serial emitted times over a sustained time, do not lose said temporal resolution at pulse frequencies synchronized with the emitted array frequency.

9. The system of claim 8, wherein the sustained emitted times of sensor pulses stimulated by the target, which selectively propagate as the serial output 1D pulses, do not necessarily encode, multiplex or attach the information of the 2D array locations of emitting nodes in a reduced said pulse frequency or synchronous said pulse frequency of serially convergent 1D output pulses that converge as 1D input pulses to at least one nodes in the last array.

10. The system of claim 8, whereby the stimulus feature pattern emits temporally synchronous pulses from a group of the sensors or nodes via links to at least one the serial nodes, which rapidly emit output pulses only when the feature pattern substantially matches the sensor or node group pattern, whereby converged 1D output pulses input to downstream nodes that reemit pulse outputs from substantially synchronous pulses from more complex node groups, and thereby rapidly and selectively propagate the minimized durations of serially summated pulses, so operationally connecting the array locations of stimulated sensors with at least one the nodes in the last array.

11. The system of claim 10, wherein the sensor pulses emitted at the array frequency, synchronize with the pulse frequencies by adjusting the parameters, whereby the adjustment synchronizes the pulse frequency emitted by the features of the target with the duration to at least one downstream serial nodes, in which a pulse timing precision at serial nodes increases with the increased pulse numbers summating within a shorter duration of time, in which the rapidly reemitted pulses, at maximized frequencies with closer emitted times, are a temporal measure of the precision of the target features.

12. The system of claim 11, comprising that the adjustment of the parameters varies varies the pulse frequencies to at least one the nodes in the last array, which empirically selects the precise and accurate emitted pulses of the target features from pulses emitted by similar features of a different target, but which similar target features selectively propagate 1D output pulses, with all other factors kept controlled, via at least one of a) reemitted pulses of a lesser number and reduced frequency to at least one a same said target-selective nodes in the last array, and b) reemitted pulses of a differing frequency to one or more different nodes with differing target selectivities in the last array.

13. The system of claim 12, wherein the selective propagation of pulses reemitted to at least one the nodes in the last array, accurately recognizes a same precise target features empirically determined by prior presentation of the target, shown by convergence of serial 1D pulses to at least one the target-selective nodes in the last array, and empirically tested with different targets composed of similar features, in which pulses from the same target features selectively propagate, maximal frequency output pulses, due to convergence of temporally synchronous pulses emitted by the same target features to downstream nodes in serial arrays, which reemitted pulses thereby operationally connect the sustained pulses emitted from the sensor array by the same precise 2D target features, with at least one the same said target stimulated said groups of at least one nodes in the last array that maximally respond to serial said 1D pulses of a 1D invariances of the feature pattern.

14. The system of claim 13, wherein said target feature pulses emitted at the sensor array frequency, which selectively propagate maximal frequencies of temporally synchronous pulses at convergent nodes, thereby serially emit invariant 1D pulse outputs from variable 2D orientations, locations and sizes of the same target features, by adjustment of the parameters, thereby operationally connecting the variable 2D sensor array locations that serially converge 1D output pulses stimulated by the precise target features, with at least one target-stimulated an invariant nodes in the last array.

15. The system of claim 14, further comprising additional nodes that record the emitted time and the 2D sensor location of pulses emitted by said sensor array, with a record of a received time and the location of at least one said nodes in the last array that receives serially reemitted pulses that converge maximal frequencies from said precise target features and similar target features, for empirical determination of a specific said sensor emitted and reemitted 1D pulses to the invariant target-selective nodes in the last array.

16. The system of claim 14, wherein pulses temporally synchronized at the same said pulse frequencies or the harmonics thereof, adjusted by at least one the parameters, in which temporally synchronous convergence of pulses at downstream serial nodes, serially reemit convergent 1D output pulses to the nodes in the last array, reduce output pulse frequencies and increase also by convergence, the precise features selected by the stimulated nodes in serial downstream arrays, in which the selective propagation of 1D pulses to at least one node in the last array, does not require the specific 2D sensor locations to be computed to correct varying 2D sensor locations stimulated by the same target features, in convergent 1D pulses to at least one the nodes in the last array.

17. The system of claim 16, wherein the pulses emitted by at least one the moving sensor arrays when stimulated by at least one the target feature pattern and target moving event, increase pulse frequency as the sensor array nears the target, due to a larger looming size of the target area, which increases the number of stimulated sensors, thereby causing more precise alignment of the sensors in the array due to a lessening distance to said target, whereby the increased pulse frequencies due to the looming size of said target converge, summate and reemit more rapidly, at higher pulse frequencies, in downstream nodes to at least one the nodes in the last array;

wherein pulses emitted by the sensor array increase due to an increased a relative parallax motion of the target due to the lesser distance to the sensors, in which the increase in the relative parallax motion causes increased reemission of high frequency pulses, causing increased said maximal frequencies of pulses to converge to at least one the nodes in the last array, thereby operationally connecting at least one the nodes in the last array with concurrently emitted pulses stimulated by a moving target at 2D sensor locations, which aligns the position of the implement or prosthesis with the target location, more accurately and precisely due to higher pulse frequencies, as the looming sensor array lessens the distance to zero at the target.

18. The system of claim 1, wherein pulses or spikes are both implementable as similar moving 1D locations with emitted times at the array frequency, but that in embodiments here, do not necessarily encode informational 2D signals to match with at least one of a visual and haptic sensor image stored in memory.

19. The system of claim 1, wherein embodiments are at least one of digital and analog circuits in nodal networks implemented as at least one of neural networks, robotic graspers, brain computer interfaces and prosthetic devices, in which at least one of speed and accuracy and precision of target recognition, categorization and location are increased by the embodiments described.

20. A method comprising emission of at least one a pulses from an initial sensor array stimulated by at least one of 1) a target feature pattern and 2) a moving target event, in which pulses selectively propagate in steps of a serial summations of temporally synchronous pulses at a serial nodes in a set of serial arrays, reemitting to at least one the nodes in the last serial array;

wherein the serial nodes serially summate pulses with serial emitted times set by configuration of an initial sensor array frequency, to summate output pulses to downstream nodes, including at least one the nodes in the last array, whereby said steps of selective convergence of pulses at serial nodes establishes at least one of a pulse frequencies, which summates pulse latencies as a duration at each serial downstream nodes adjusted with a period parameters to emit at least one pulses to downstream nodes in serial arrays, thereby operationally connecting, at the pulse frequencies or a harmonics thereof, the concurrent pulses emitted from sensors by the target feature pattern or event, with at least one an empirically determined the nodes in the last array that responds maximally to a minimized total duration of pulses emitted by at least one the target features and moving target event;

wherein said minimized total duration of pulses results from a looming size or a relative parallax of a precise the target as it nears the sensor array, so that as the sensor array reduces the distance in steps to zero nearest the target, the reemitted pulse frequency increases, thereby increasing the temporal and spatial resolution of pulses emitted by the sensors.

* * * * *

UNITED STATES PATENT AND TRADEMARK OFFICE
CERTIFICATE OF CORRECTION

| | | |
|---|---|---|
| PATENT NO. | : 10,769,447 B1 | Page 1 of 2 |
| APPLICATION NO. | : 15/732565 | |
| DATED | : September 8, 2020 | |
| INVENTOR(S) | : Kirch | |

It is certified that error appears in the above-identified patent and that said Letters Patent is hereby corrected as shown below:

On the Title Page

Under abstract "20 Claims, 9 Drawing Sheets" should read --20 Claims, 10 Drawing Sheets--.

In the Drawings

Please add FIG. 2 as shown on the attached page.

Signed and Sealed this
Twenty-fourth Day of November, 2020

Andrei Iancu
*Director of the United States Patent and Trademark Office*